United States Patent
Shimizu et al.

(10) Patent No.: US 10,193,312 B2
(45) Date of Patent: Jan. 29, 2019

(54) HIGH FREQUENCY DISCHARGE IGNITION APPARATUS

(71) Applicant: Mitsubishi Electric Corporation, Tokyo (JP)

(72) Inventors: Yasuyuki Shimizu, Tokyo (JP); Takaaki Tanaka, Tokyo (JP); Yusuke Naruse, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 336 days.

(21) Appl. No.: 15/246,633

(22) Filed: Aug. 25, 2016

(65) Prior Publication Data

US 2017/0294764 A1    Oct. 12, 2017

(30) Foreign Application Priority Data

Apr. 7, 2016   (JP) ................. 2016-076988

(51) Int. Cl.
*H01T 15/00* (2006.01)
*H05K 5/02* (2006.01)
(Continued)

(52) U.S. Cl.
CPC ............ *H01T 15/00* (2013.01); *F02P 3/02* (2013.01); *F02P 9/007* (2013.01); *H01F 38/12* (2013.01);
(Continued)

(58) Field of Classification Search
CPC ...... F02P 3/02; F02P 9/007; F02P 3/01; F02P 3/0407; H01F 38/12; H05K 5/00247; H05K 5/04
See application file for complete search history.

(56) References Cited

U.S. PATENT DOCUMENTS

| 4,483,423 A | * | 11/1984 | Renzelmann | ........... F16D 59/00 |
| | | | | 188/134 |
| 2002/0017271 A1 | * | 2/2002 | Suckewer | ............. F02D 19/081 |
| | | | | 123/297 |

(Continued)

FOREIGN PATENT DOCUMENTS

JP    2015-078666 A    4/2015

OTHER PUBLICATIONS

Communication dated Mar. 14, 2017, issued from the Japan Patent Office in counterpart Japanese Patent Application No. 2016-076988.

*Primary Examiner* — Zeev V Kitov
(74) *Attorney, Agent, or Firm* — Sughrue Mion, PLLC; Richard C. Turner

(57) ABSTRACT

In order to transmit high frequency energy to a coupling circuit, if the high frequency energy is transmitted via a harness provided with a high-voltage cable, the loop in which the high frequency energy is conducted is long, and thus, noise occurring from the loop is increased. Thus, shielding is needed to be provided to the entire apparatus. The present invention has a structure in which: a high frequency energy supply circuit and a coupling circuit are connected by a connection member; and a housing having therein the high frequency energy supply circuit is integrated with a housing having therein the coupling circuit. Accordingly, the entire apparatus can be downsized and noise occurring from the loop can be reduced.

19 Claims, 33 Drawing Sheets

(51) Int. Cl.
    *H05K 5/04*     (2006.01)
    *F02P 3/02*     (2006.01)
    *F02P 9/00*     (2006.01)
    *H01F 38/12*     (2006.01)
    *F02P 3/01*     (2006.01)
    *F02P 3/04*     (2006.01)

(52) U.S. Cl.
    CPC ............ *H05K 5/0247* (2013.01); *H05K 5/04* (2013.01); *F02P 3/01* (2013.01); *F02P 3/0407* (2013.01)

(56) References Cited

U.S. PATENT DOCUMENTS

| | | | |
|---|---|---|---|
| 2014/0299085 A1* | 10/2014 | Ikeda | F02B 9/00 123/143 B |
| 2015/0108914 A1 | 4/2015 | Muramoto et al. | |
| 2016/0341170 A1* | 11/2016 | Ota | F02P 9/007 |

\* cited by examiner

CROSS SECTION A-A

HIGH FREQUENCY DISCHARGE IGNITION APPARATUS

BACKGROUND OF THE INVENTION

Field of the Invention

The present invention relates to a structure of a high frequency discharge ignition apparatus that is mainly used in an internal combustion engine.

Description of the Related Art

In recent years, issues such as environment preservation and fuel depletion have been raised, and measures for these issues should be urgently taken also in the automobile industry. As example of such measures, there is a method for improving fuel consumption through engine downsizing by use of a supercharger.

However, it is known that in a high-supercharge state, the pressure in an engine combustion chamber becomes very high even when no combustion occurs, which makes it difficult to produce a spark discharge for starting combustion. In order to solve this problem, it is necessary to narrow the gap interval in an ignition plug to increase the withstand voltage. However, if the gap of the ignition plug is narrowed, the influence of the extinguishing action by electrode portions becomes large in turn, which causes problems such as reduced startability and reduced combustion performance.

In order to solve this problem, means is conceivable in which energy exceeding the extinguishing action, i.e., exceeding thermal energy absorbed by the electrode portions, is provided through spark discharge. For example, a high frequency discharge ignition apparatus as disclosed in Patent Document 1 has been proposed.

The high frequency discharge ignition apparatus disclosed in Patent Document 1 causes a conventional ignition coil to produce a spark discharge in an ignition plug gap, and puts a stable and desired high frequency energy in the path of the spark discharge via a coupling circuit formed by a capacitor, thereby enabling a high-energy spark discharge and production of discharge plasma that spreads wider than an ordinary spark discharge.

CITATION LIST

Patent Document

Patent Document 1: Japanese Laid-Open Patent Publication No. 2015-78666

SUMMARY OF THE INVENTION

Problems to be Solved by the Invention

FIG. 31 shows a block diagram of a circuit configuration of the conventional high frequency discharge ignition apparatus disclosed in Patent Document 1. This is a system in which: voltage of a power supply 101 is converted into high frequency energy by an apparatus 100 including a step-up circuit 102 and a high frequency energy supply circuit 103; the converted high frequency energy and spark discharge energy from an ignition coil 105 are coupled in a coupling circuit 104; and the coupled energy is put into a spark discharge path of an ignition plug 40. In the case of the conventional high frequency discharge ignition apparatus shown in Patent Document 1, for transmitting high frequency energy generated in the high frequency energy supply circuit to the coupling circuit, there is a method of transmitting the high frequency energy via a harness composed of a connector and a high-voltage cable, for example. However, in this case, a loop 106 in which the high frequency energy is conducted is long, and thus, noise occurring from the loop 106 is increased. In addition, since the loop 106 is long, the range to provide shielding in the entirety of the apparatus including the harness is increased, which poses a problem that taking measures against noise is difficult.

The present invention has been made in order to solve the problem regarding the configuration of the above-described conventional apparatus. An object of the present invention is to provide, in a small space, a high frequency discharge ignition apparatus having a structure which suppresses noise occurring from the entirety of the loop in which high frequency energy is conducted, thereby suppressing influence to peripheral devices.

Solution to the Problems

A high frequency discharge ignition apparatus according to the present invention is a high frequency discharge ignition apparatus for coupling high frequency energy supplied from a high frequency energy supply circuit, with a high voltage pulse supplied from an ignition coil, and supplying the coupled energy to an ignition plug, the high frequency discharge ignition apparatus including: a first housing having therein an output circuit for supplying the coupled energy to the ignition plug; a second housing having therein the high frequency energy supply circuit; and a connection member electrically connecting the output circuit and the high frequency energy supply circuit to each other, wherein the first housing and the second housing are fixed to each other with faces thereof opposed to each other, and the connection member is connected via pass-through portions provided at positions that are close to each other in the respective opposed faces.

Effect of the Invention

According to the high frequency discharge ignition apparatus of the present invention, the length of the loop in which high frequency energy is conducted is reduced, whereby noise can be reduced.

DETAILED DESCRIPTION OF THE PREFERRED EMBODIMENTS

Figure 1:
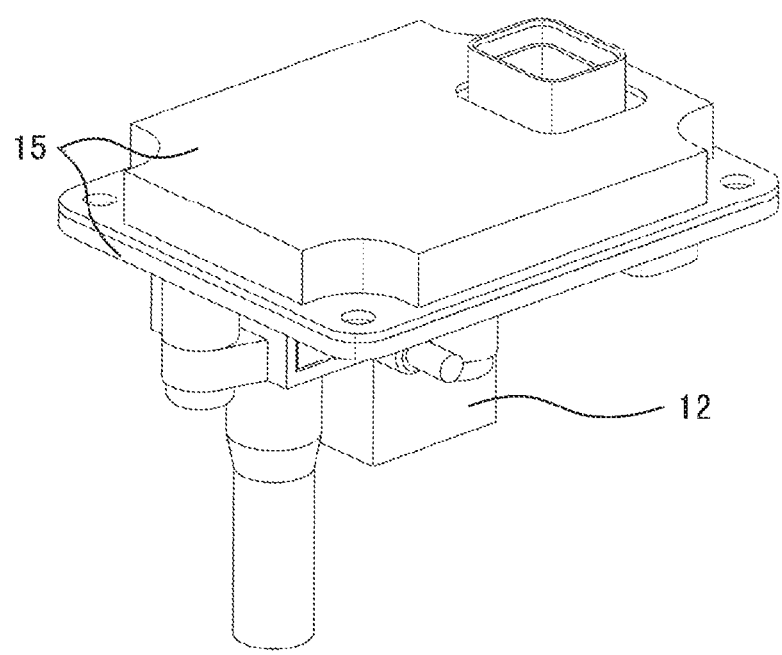
FIG. 1 is a perspective view of a high frequency discharge ignition apparatus having been assembled according to embodiment 1 of the present invention.

Hereinafter, an embodiment of a high frequency discharge ignition apparatus in the present invention will be described with reference to the drawings. In the drawings, the same or equivalent portions are denoted by the same reference characters.

In the present embodiment, it is assumed that the voltage of "high voltage pulse" is 30 to 40 kV, the voltage of "high frequency energy" is 1 to 2 kV, and the frequency of "high frequency" is several hundred kHz to several MHz.

Embodiment 1

FIG. 1 is a perspective view of a high frequency discharge ignition apparatus having been assembled, in embodiment 1 of the present invention.

Figure 2:
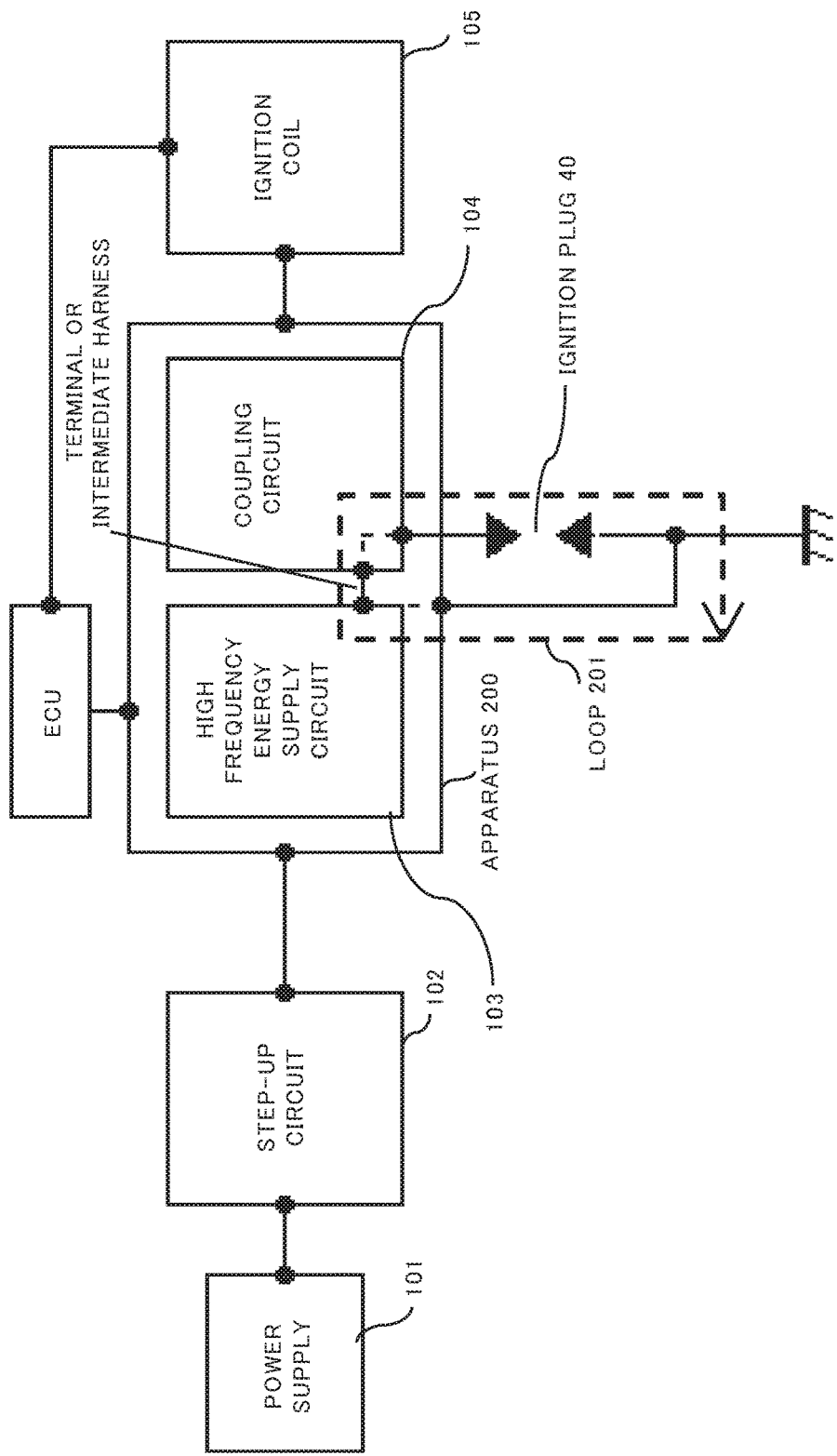
FIG. 2 is a block diagram showing a circuit configuration of the high frequency discharge ignition apparatus according to embodiment 1 of the present invention.
Figure 31:
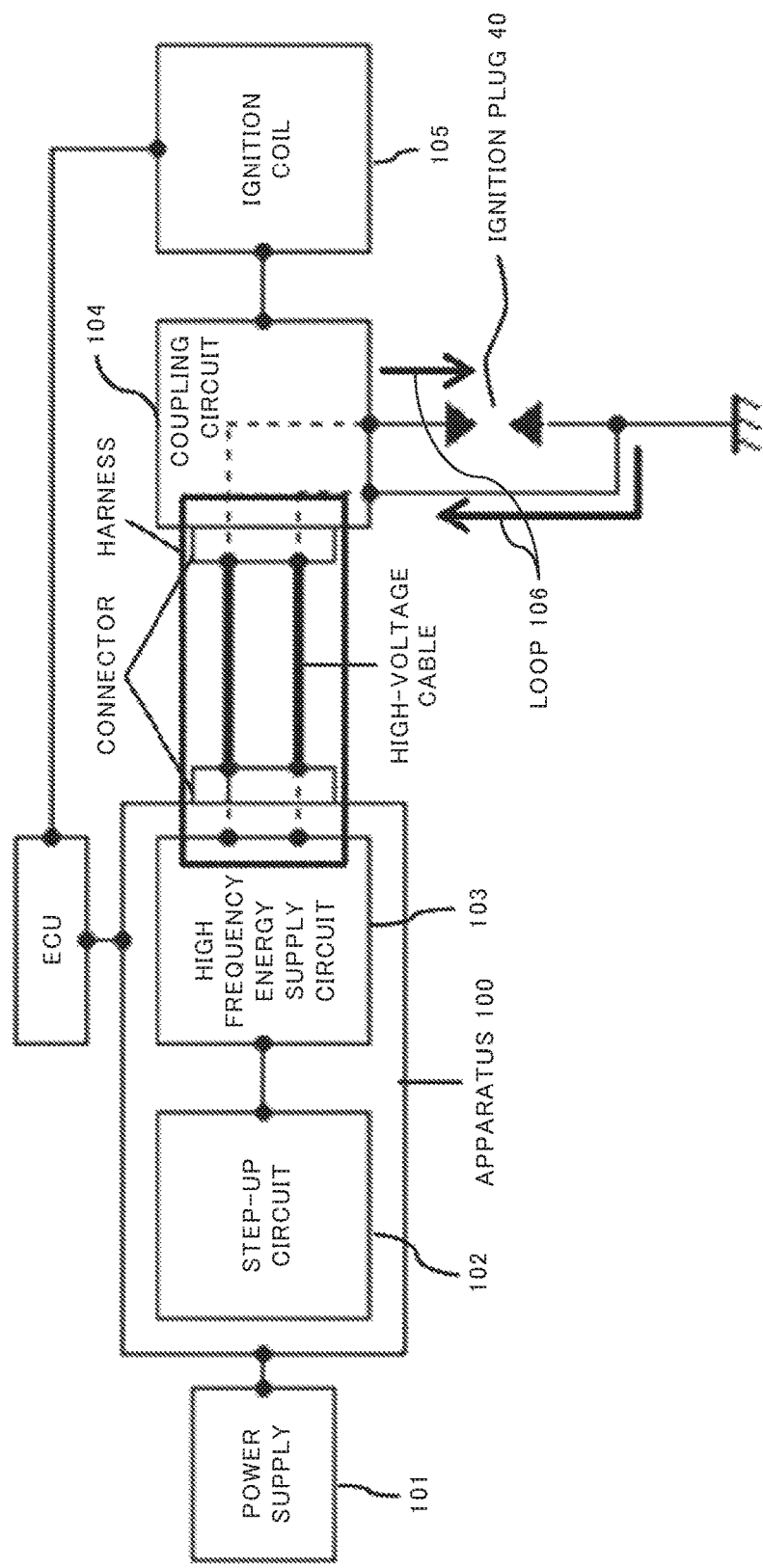
FIG. 31 shows a configuration of a conventional ignition apparatus described in Patent Document 1.

FIG. 2 is a block diagram of a circuit configuration of the high frequency discharge ignition apparatus in embodiment 1 of the present invention. Compared with a conventional example shown in FIG. 31, no high-voltage cable is present, and a loop 201 in which high frequency energy is conducted is short.

Figure 3:
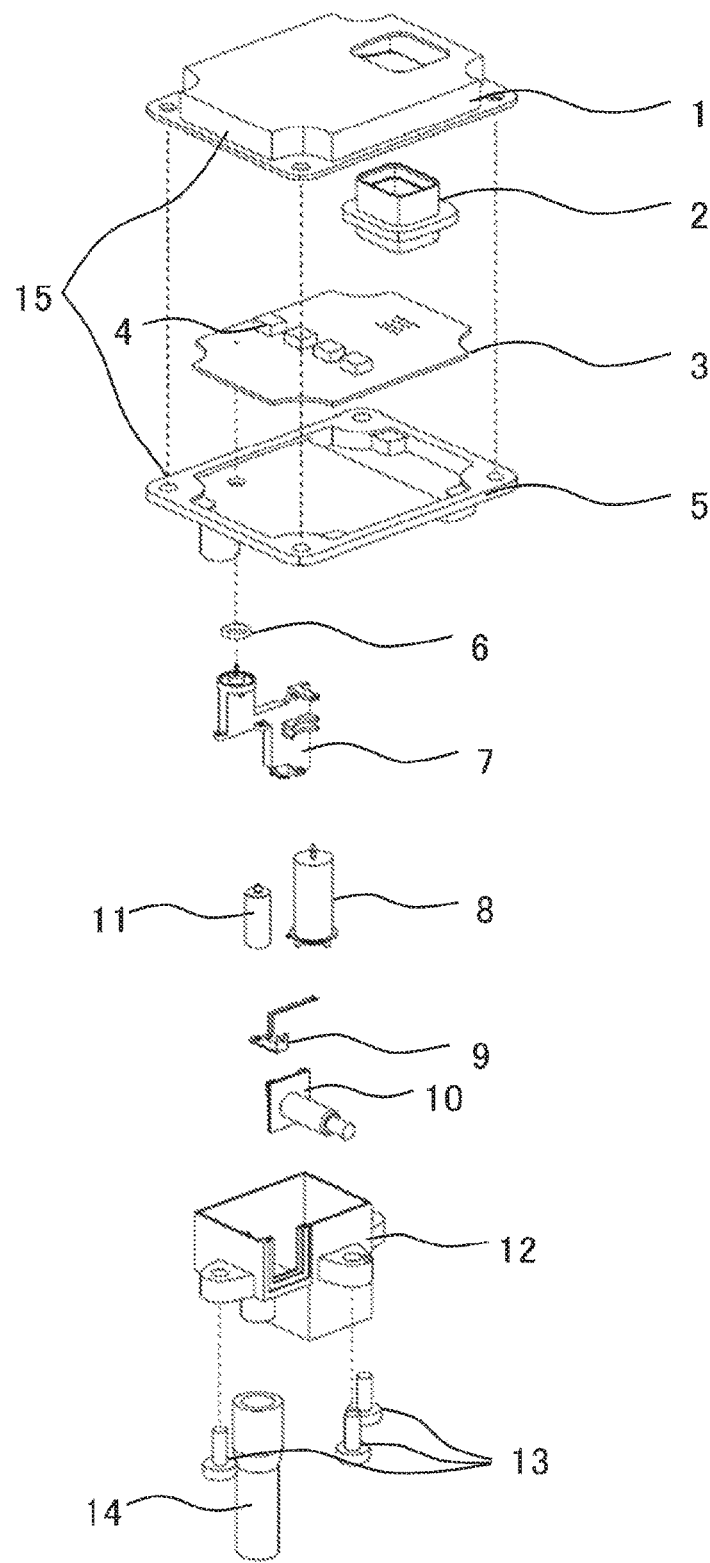
FIG. 3 is an exploded perspective view showing an example of an internal configuration of the high frequency discharge ignition apparatus in embodiment 1 of the present invention.

FIG. 3 is an exploded perspective view showing an example of an internal structure of the high frequency discharge ignition apparatus in embodiment 1 of the present invention. The high frequency discharge ignition apparatus in the present embodiment 1 includes the following components: a cover 1; a connector 2; an electronic circuit board 3; electronic components 4 provided on the electronic circuit board 3; a base 5; a packing 6; a terminal 7; an electronic component 8; terminal members 9, 10, and 11; a first housing 12; bolts 13; a protector 14; and a second housing 15 composed of the cover 1 and the base 5. In FIG. 3, the electronic component 8 is housed in the first housing 12.

Figure 4:
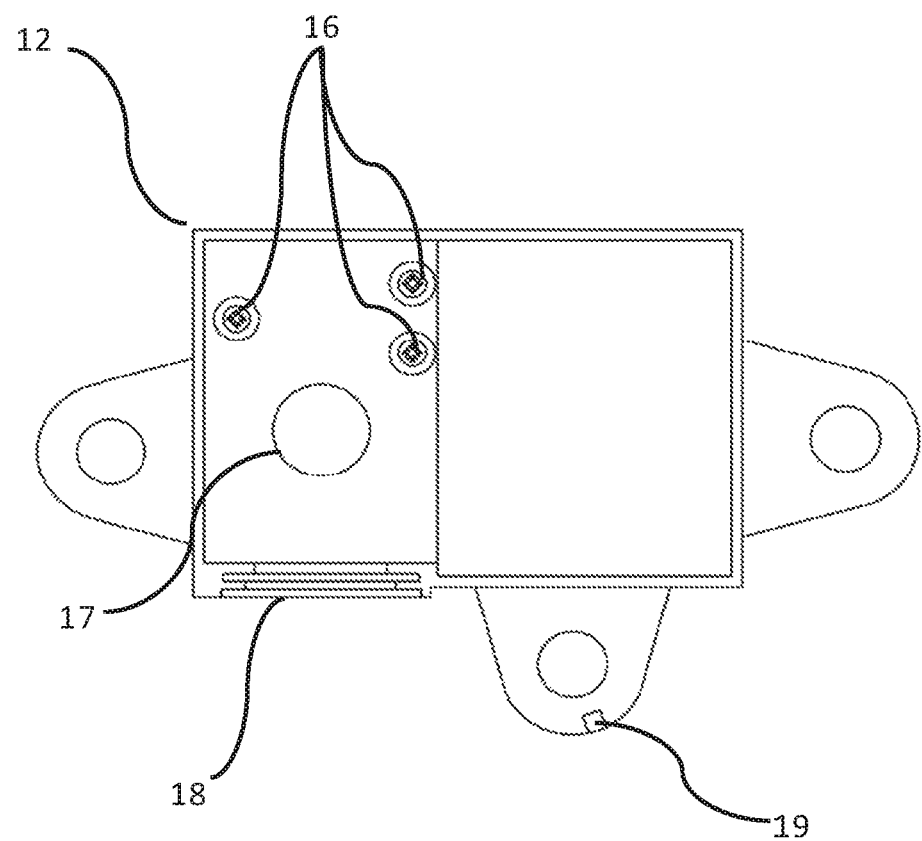
FIG. 4 is a top view of a first housing 12.

FIG. 4 is a top view of the first housing 12. The first housing 12 includes therein: crush ribs 16; a fit portion 17 to be fitted with the terminal member 11; a fit portion 18 to be fitted with the terminal member 10; and a protruding portion 19 to be mated with the base 5.

Figure 5:
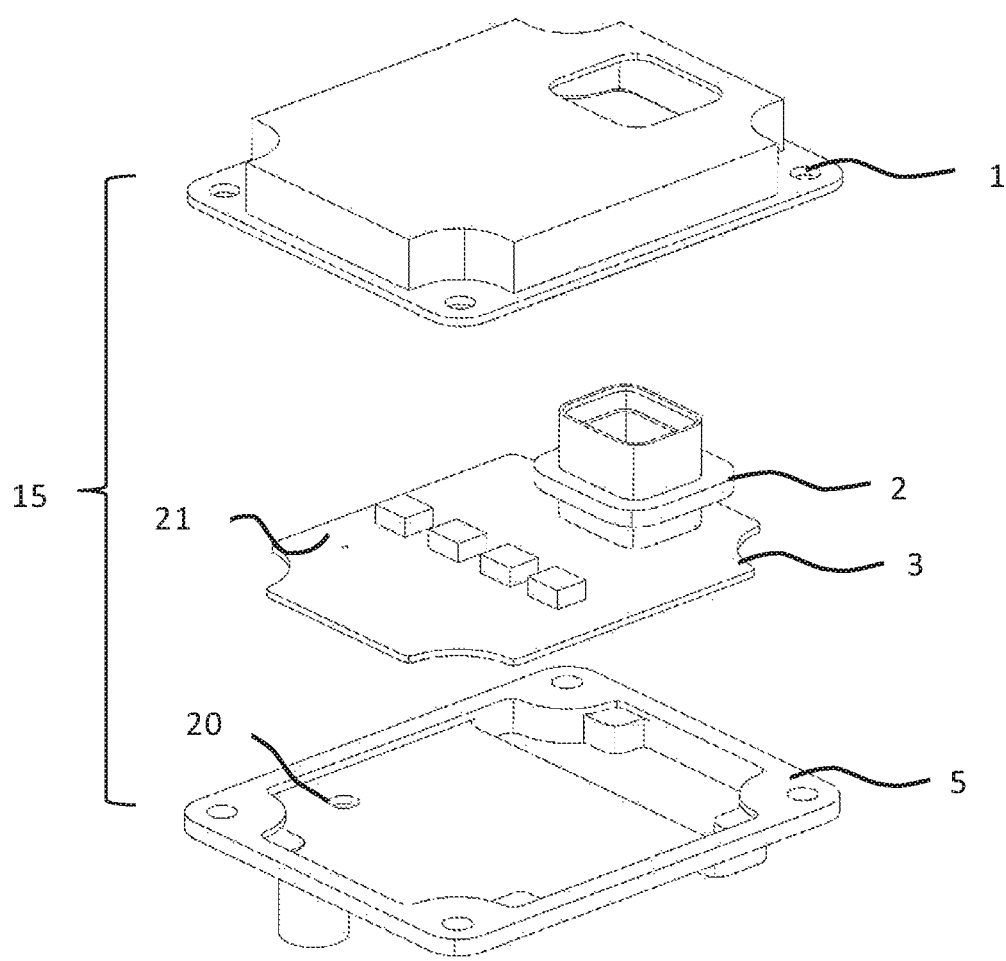
FIG. 5 is a perspective view showing a configuration of a second housing 15.

FIG. 5 is a perspective view showing a configuration of the second housing 15. The base 5 includes an opening 20 through which the terminal 7 passes. The electronic circuit board 3 is housed in the second housing 15. Further, the electronic circuit board 3 is provided with the connector 2 for providing connection to an external apparatus (not shown). Further, the electronic circuit board 3 includes a through hole 21.

Figure 6:
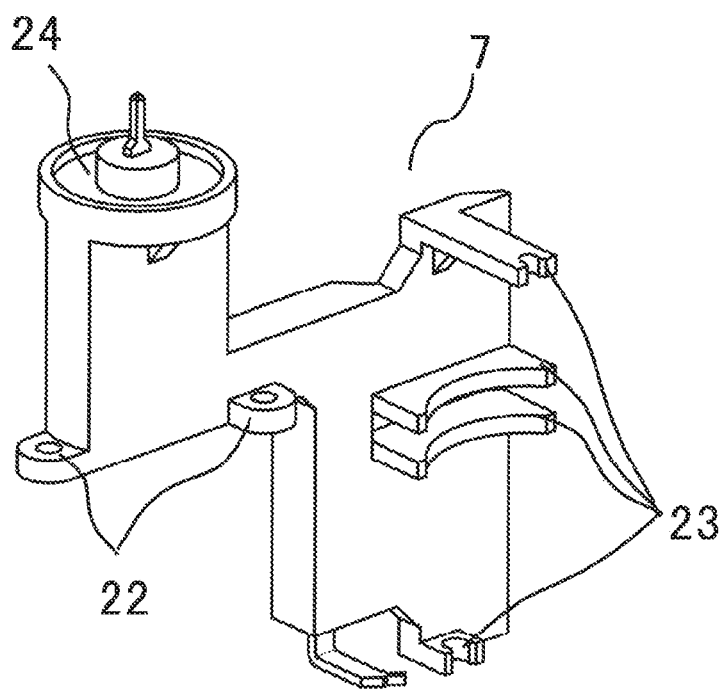
FIG. 6 is a perspective view showing the external shape of a terminal 7.

FIG. 6 is a perspective view showing the external shape of the terminal 7. The terminal 7 has, by multiple molding with a resin material, holding portions 22, fit portions 23 to be fitted with the electronic component 8, and a groove portion 24.

Figure 7:
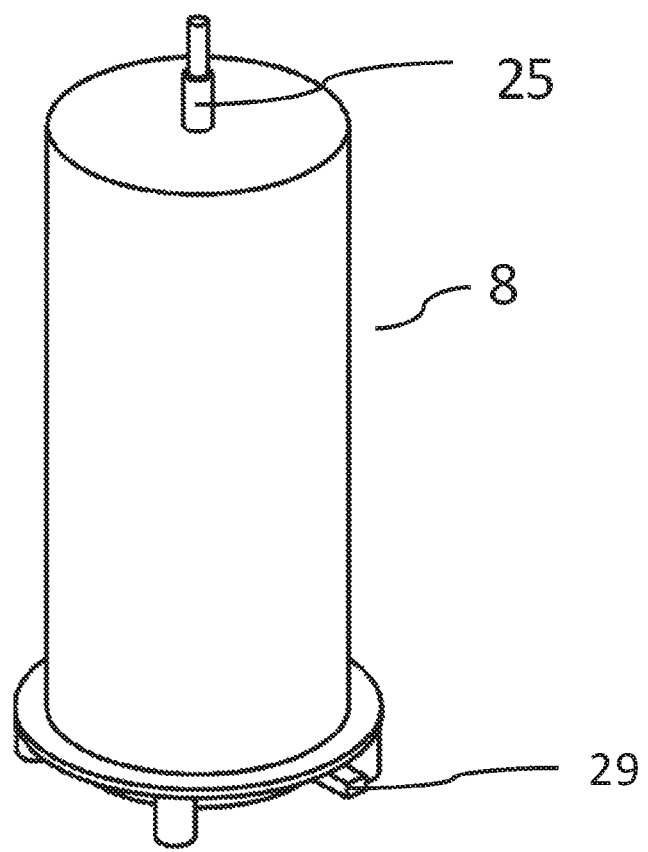
FIG. 7 is a perspective view showing the external appearance of an electronic component 8.

FIG. 7 is a perspective view showing the external shape of the electronic component 8. The electronic component 8 includes fit portions 25 to be fitted with the terminal 7.

Figure 8:
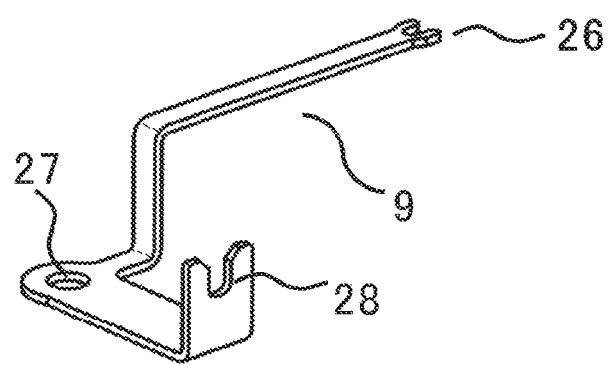
FIG. 8 is a perspective view showing the external appearance of a terminal member 9.

FIG. 8 is a perspective view showing the external shape of the terminal member 9. The terminal member 9 includes: a fit portion 26 to be fitted with the electronic component 8; a fit portion 27 to be fitted with the terminal member 11; and a fit portion 28 to be fitted with the terminal member 10.

First, functions of elements of the high frequency discharge ignition apparatus in the present embodiment 1 shown in FIG. 3 to FIG. 8 will be described.

The electronic circuit board 3 includes, on the printed circuit board thereof, electronic components 4 forming a high frequency energy circuit, such as an input/output circuit, a control circuit, a microcomputer, and a power supply circuit.

Each of the first housing 12 and the second housing is formed of aluminium, stainless steel, PBT resin, or the like, for example. However, the material of the first housing 12 and the second housing 15 is not limited thereto. One side 33 of the terminal 7 is inserted into the through hole 21 in the electronic circuit board 3, and is electrically connected and fixed to a circuit (not shown) such as an input/output portion of the electronic circuit board 3. The other side of the terminal 7 is electrically connected to the electronic component 8.

The terminal member 10 is used for providing connection between an ignition coil (not shown) and the terminal member 9, the terminal member 11 is used for providing connection between an ignition plug (not shown) and the terminal member 9, and the terminal member 9 is used for providing connection among the terminal members 10 and 11 and the electronic component 8.

Next, the procedure of assembling the high frequency discharge ignition apparatus in the present embodiment 1 will be described.

In the present embodiment, it is assumed that the base area of the base 5 of the second housing 15 is greater than or equivalent to the base area of the first housing 12.

In addition, in the present embodiment, a high frequency discharge ignition apparatus is assumed in which, for example, by the protector 14 being mounted to an ignition plug 40, a coupling circuit and the ignition plug 40 are directly connected to each other as shown in FIG. 2.

Figure 9:
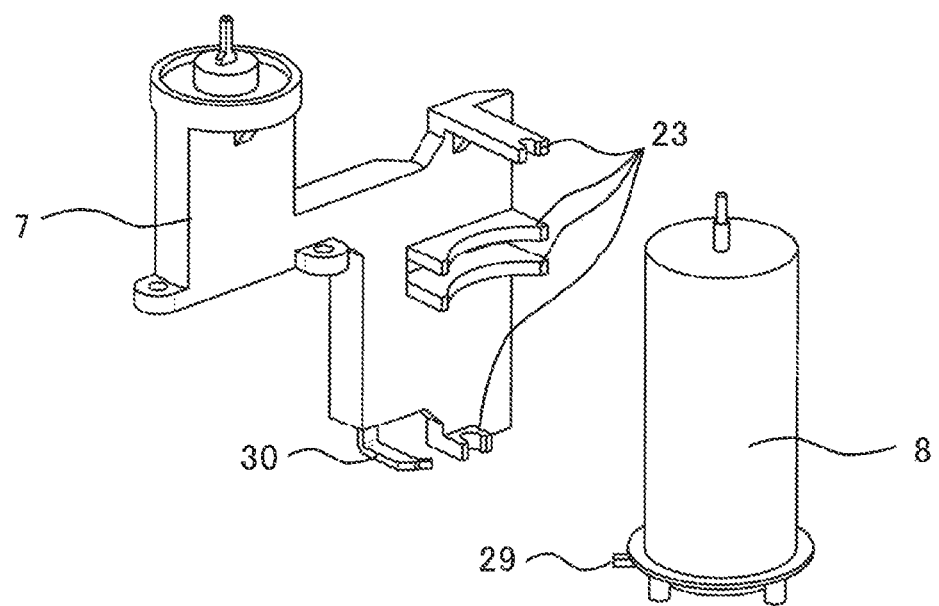
FIG. 9 illustrates attachment of a terminal 7 and the electronic component 8.

First, the fit portions 25 of the electronic component 8 are mounted to the fit portions 23 of the terminal 7, thereby fixing the electronic component 8 and the terminal 7 together. Then, a metal terminal portion 29 of the electronic component 8 and the other side 30 of the terminal 7 are welded together to be electrically connected to each other (see FIG. 9).

As a result, positioning of the electronic component 8 relative to the terminal 7 is realized.

It is noted that the connection between the metal terminal portion 29 of the electronic component 8 and the other side 30 of the terminal 7 may be provided by soldering.

Figure 10:
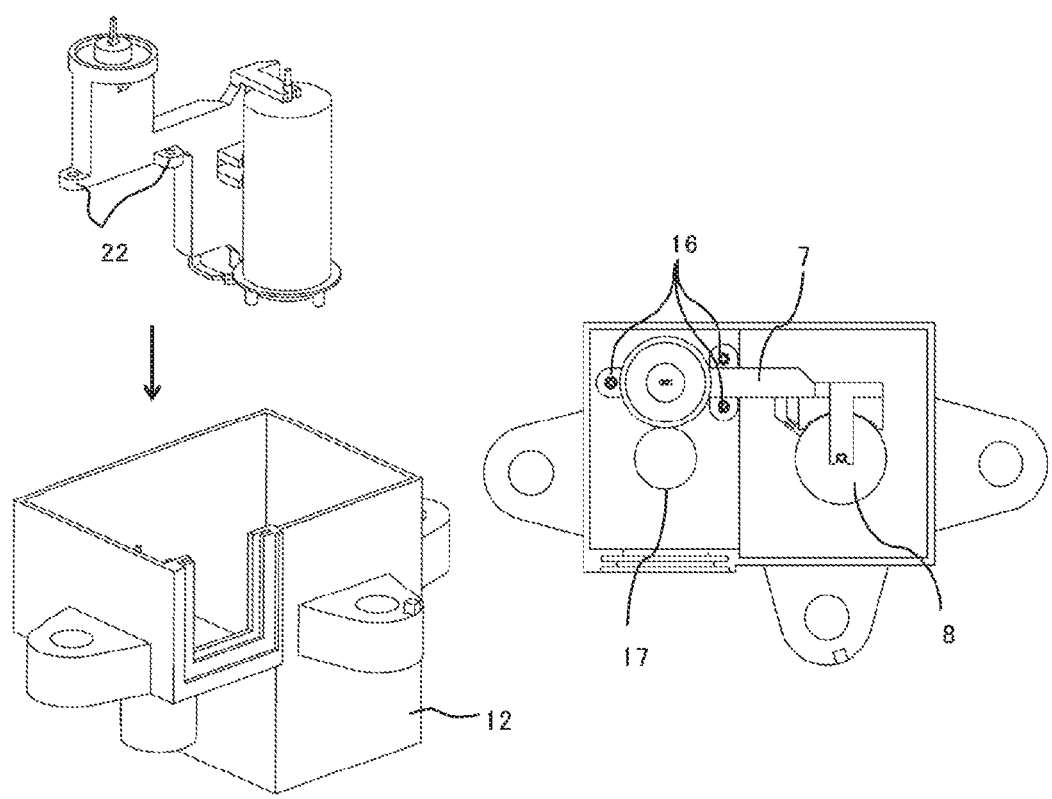
FIG. 10 illustrates arrangement of the electronic component 8 and the terminal 7 in the first housing 12.

Next, the crush ribs 16 inside the first housing 12 are fitted in the holding portions 22 of the terminal 7 (see FIG. 10).

As a result, relative positioning of the terminal 7 relative to the through hole 21 of the electronic circuit board 3 is realized.

Figure 11:
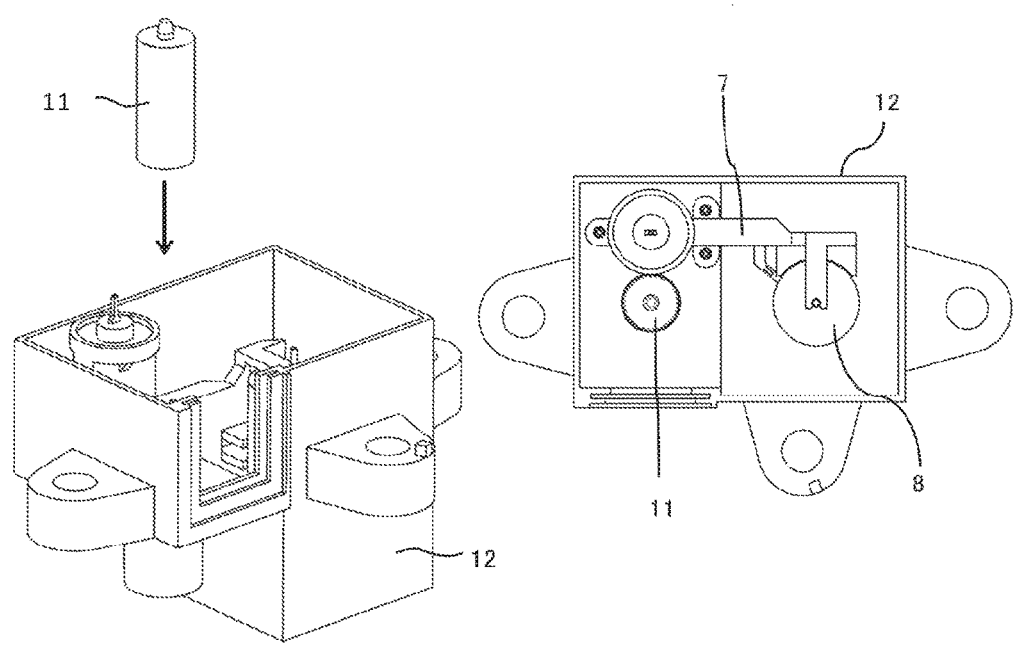
FIG. 11 illustrates insertion of a terminal member 11 into a fit portion 17.

Next, the terminal member 11 is inserted into the fit portion 17 of the first housing 12 (see FIG. 11).

Figure 12:
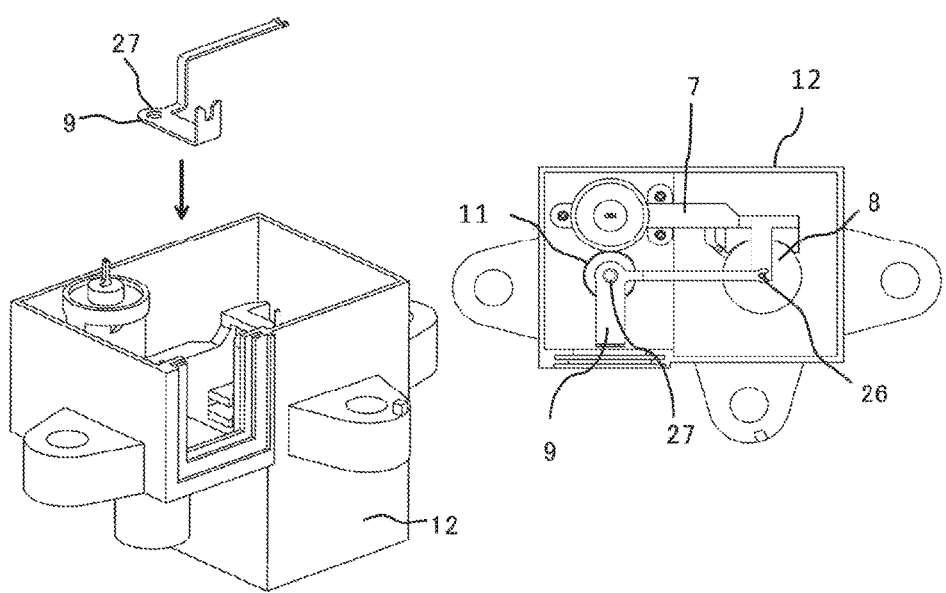
FIG. 12 illustrates connection of the terminal member 9.

In addition, the terminal member 9 and the terminal member 11 are fitted at the fit portion 27, and further, the terminal member 9 and the electronic component 8 are electrically connected to each other at the fit portion 26 (see FIG. 12).

Figure 13:
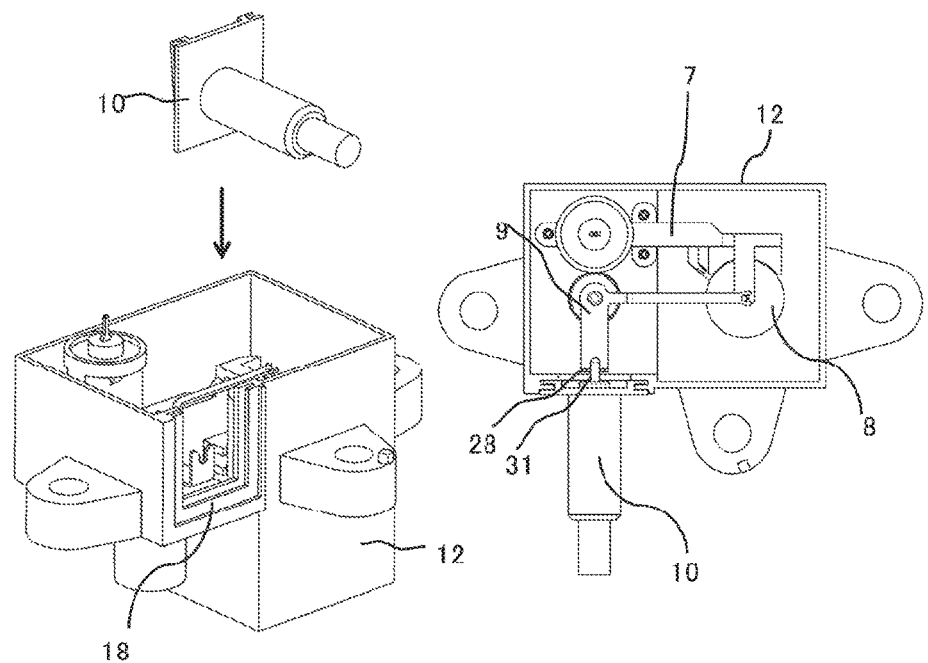
FIG. 13 illustrates connection between the terminal member 9 and a terminal member 10.

The terminal member 10 is inserted into the fit portion 18 of the first housing 12, and further, one side 31 of the terminal member 10 is fitted in the fit portion 28 of the terminal member 9, whereby the terminal member 9 and the terminal member 10 are electrically connected to each other (see FIG. 13).

It is noted that the connection between the one side 31 of the terminal member 10 and the fit portion 28 of the terminal member 9 may be provided by press fit, welding, or soldering.

Figure 14:
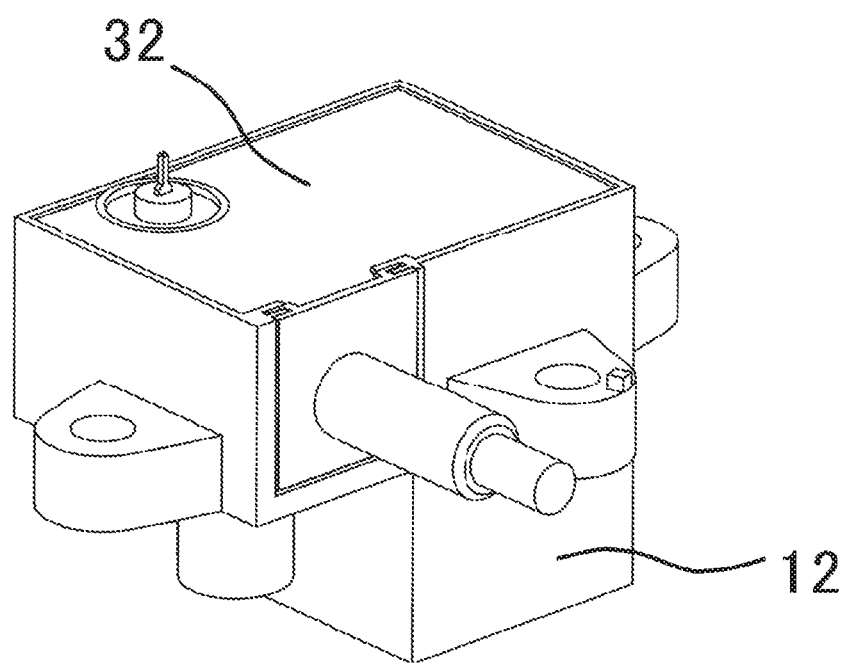
FIG. 14 is a perspective view showing a state after cast resin is poured inside the first housing 12.

Then, in a state where the components are assembled together, a cast resin 32 is poured into the first housing 12 (see FIG. 14).

Figure 15:
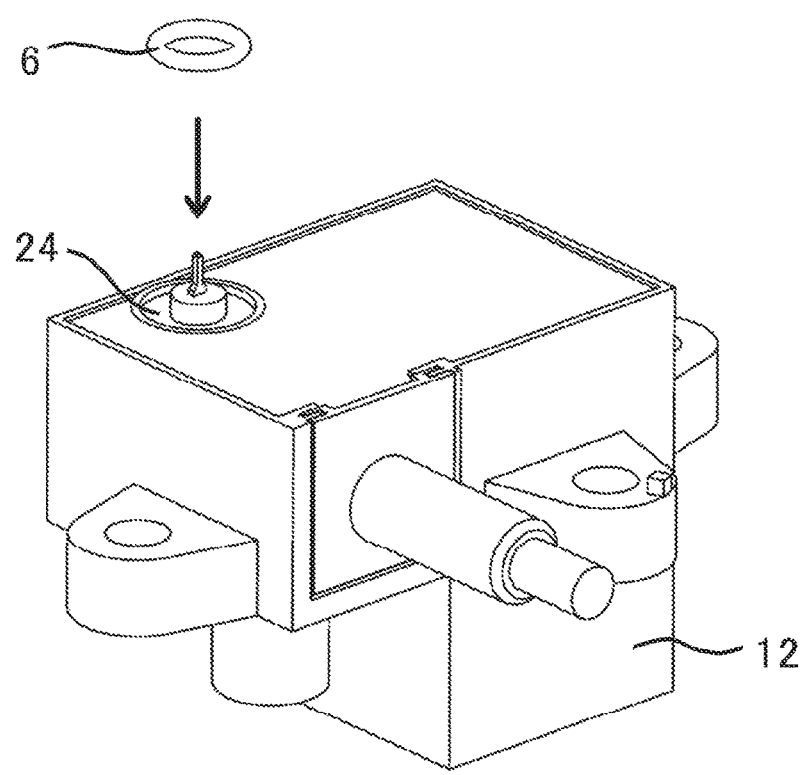
FIG. 15 is a perspective view showing a state before a packing is inserted into a groove portion of the terminal.

Next, the packing 6 is inserted in the groove portion 24 of the terminal 7 (see FIG. 15). It is noted that an adhesive may be used instead of the packing 6.

Figure 16:
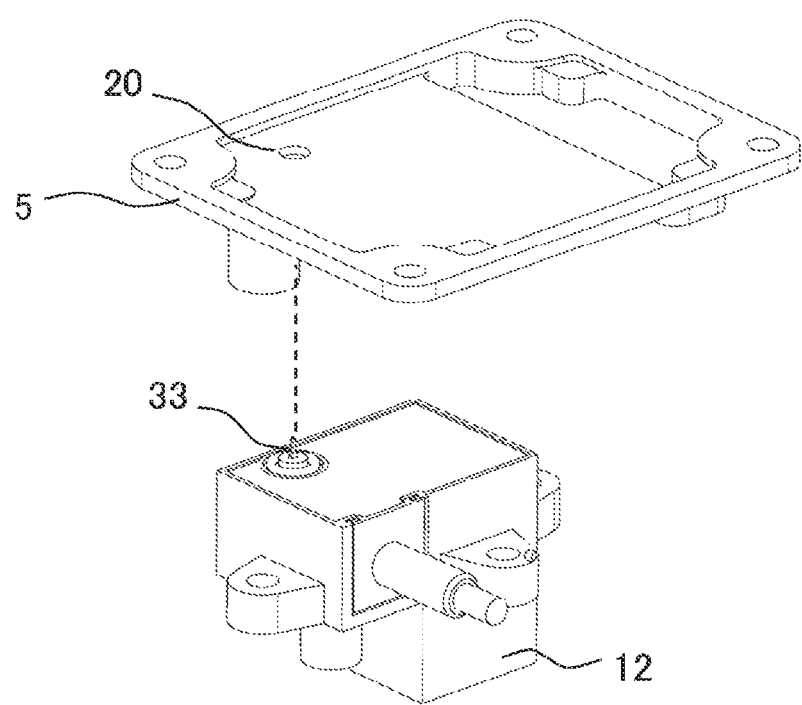
FIG. 16 is a perspective view showing a state before a base 5 of the second housing 15 is mounted to the first housing 12.

Then, the one side 33 of the terminal 7 is inserted in the opening 20 in the base 5 (see FIG. 16).

Figure 17:
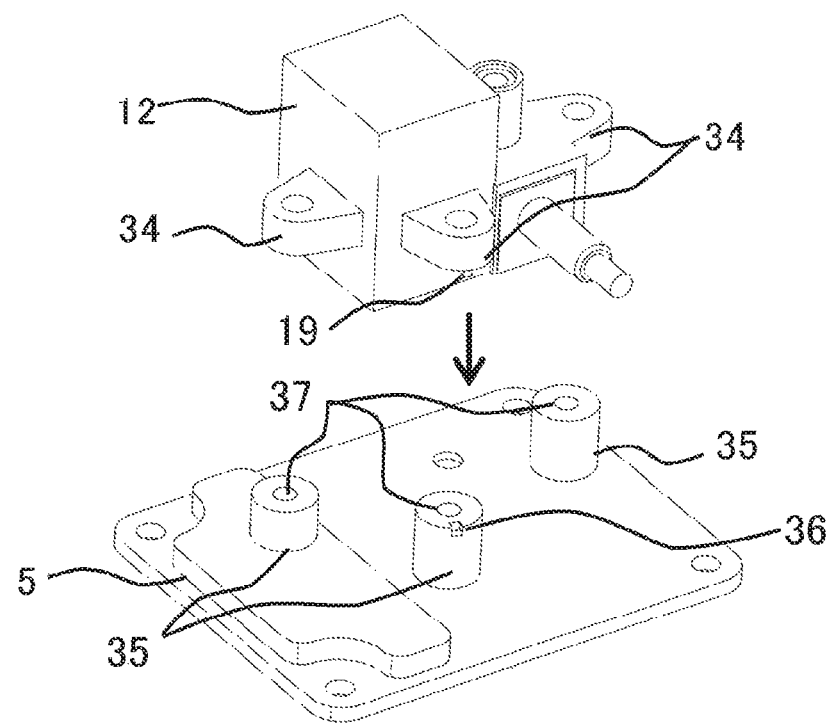
FIG. 17 is a perspective view showing the structures of the first housing 12 and the base 5.

At the same time when the one side 33 of the terminal 7 is inserted in the opening 20 in the base, a protruding portion 19 provided on a flange 34 of the first housing 12 and a groove portion 36 provided in a boss 35 on the base 5 are fitted together (see FIG. 17).

As a result, positioning between the flange 34 of the first housing 12 and the boss 35 of the base 5 are realized.

Figure 18:
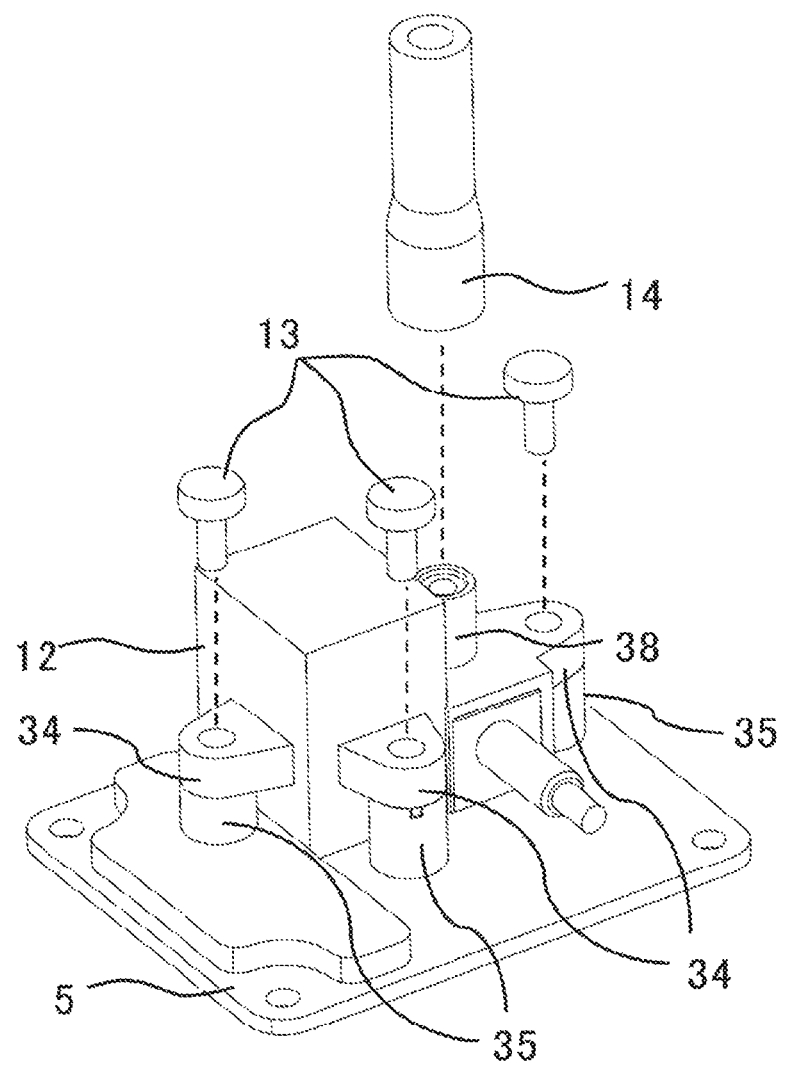
FIG. 18 is a perspective view showing a state before the first housing 12 and the base 5 are fastened together and before a protector 14 is inserted into the first housing 12.

Next, the flanges 34 of the first housing 12 and screw holes 37 provided in the bosses 35 of the base 5 are fastened together by means of screws or bolts 13 via the flanges 34. In addition, the protector 14 is fitted to a fit portion 38 of the first housing 12 (see FIG. 18).

It is noted that either one of the first housing 12 and the second housing 15 may be provided with two or more flanges, and the other one of the first housing 12 and the second housing 15 may be provided with screw holes at positions corresponding to the flanges.

As a result, waterproofing between the first housing 12 and the second housing 15 is realized.

Figure 19:
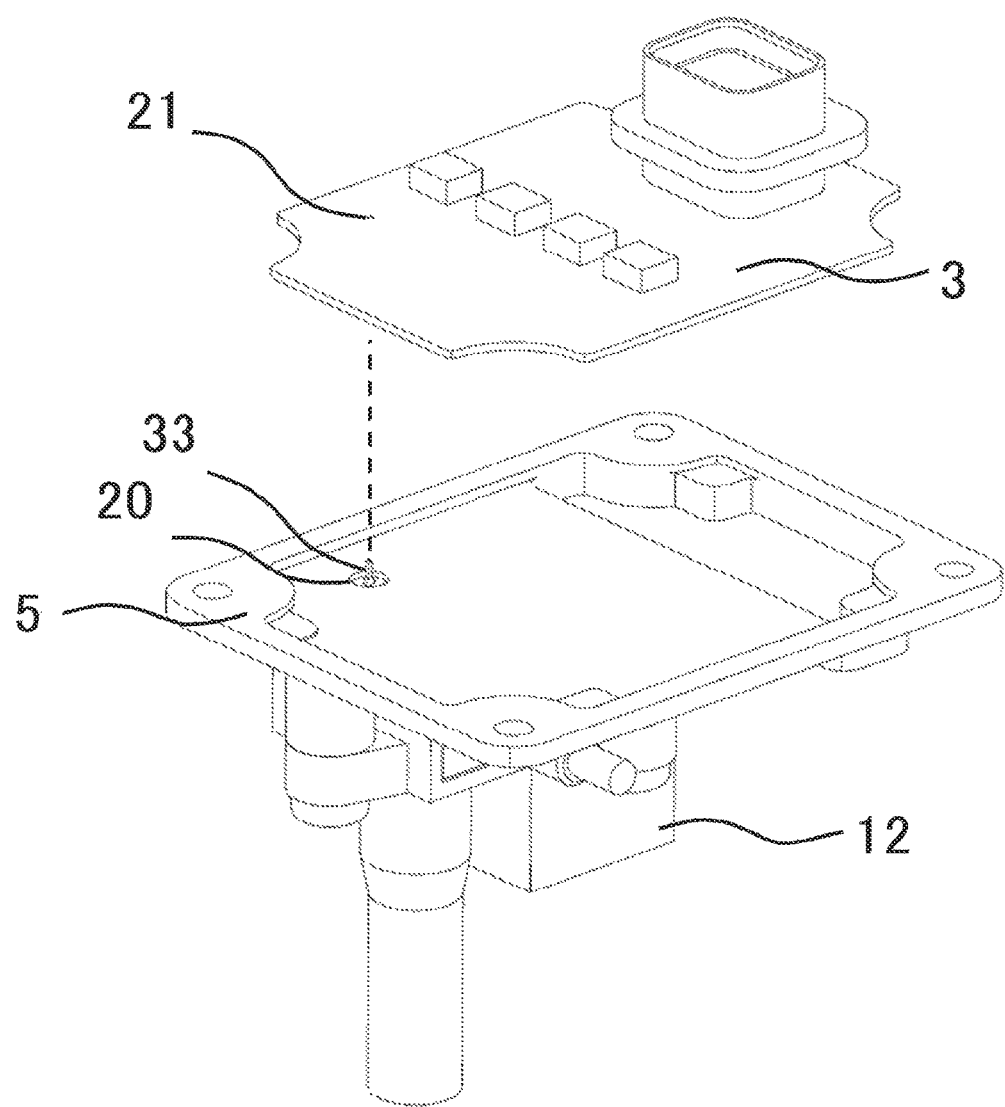
FIG. 19 is a perspective view showing a state before an electronic circuit board 3 is mounted to the base 5.

Further, the one side 33 of the terminal 7 protruding from the opening 20 in the base 5 is fitted into the through hole 21 in the electronic circuit board 3, thereby providing electrical connection therebetween (see FIG. 19). The connection may be provided by soldering or press fit.

As a result, positioning of the terminal 7 is determined such that the first housing 12 is disposed so as not to protrude beyond the base area range of the metal base of the second housing 15, which has a larger base area. Here, in order to improve earthquake resistance, the electronic circuit board 3 and the base 5 may be screwed to be fixed to each other.

Figure 20:
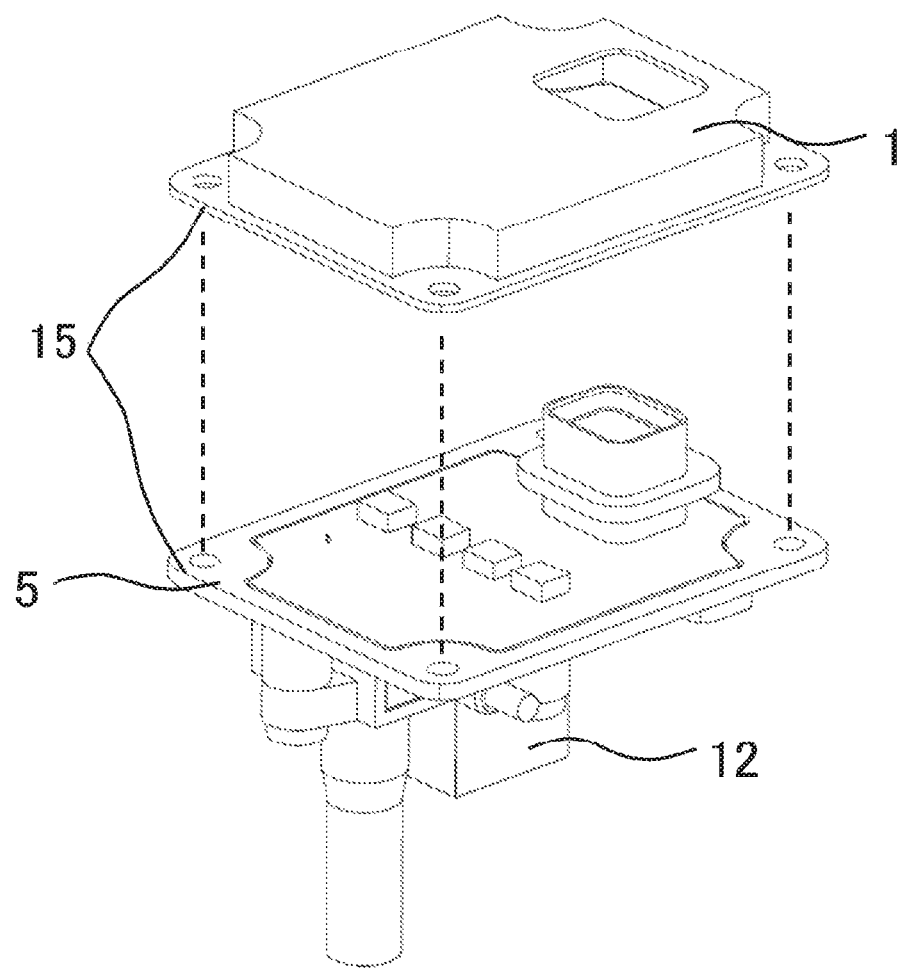
FIG. 20 is a perspective view showing a state before a cover 1 is mounted to the base 5.

Lastly, the cover 1 is mounted to the base 5 (see FIG. 20). As a result, the high frequency discharge ignition apparatus is completed in which the first housing 12 and the second housing 15 are integrally assembled together (see FIG. 1).

By performing the assembly as above, a structure is obtained in which: connection between a high frequency energy supply circuit 103 and a coupling circuit 104 is realized by means of a terminal; and the housing having therein the high frequency energy supply circuit 103 and the housing having therein the coupling circuit 104 are integrated. Accordingly, the entirety of the apparatus can be downsized. In addition, since the length of the loop 201 in which high frequency energy is conducted is reduced, noise occurring from the loop can be reduced (see FIG. 2).

Furthermore, since the loop is shortened, the range to provide shielding in the entirety of the apparatus can be reduced, and thus, it becomes easy to take measures against noise.

When the second housing 15 requires waterproof property, the mating face between the cover 1 and the base 5 may be sealed with a sealant, a packing, or the like.

Hereinafter, described are the steps of assembling the high frequency discharge ignition apparatus of embodiment 1 to a fastening target body 39 which is made of metal and which is assumed as an engine block shown in FIG. 21.

Figure 21:
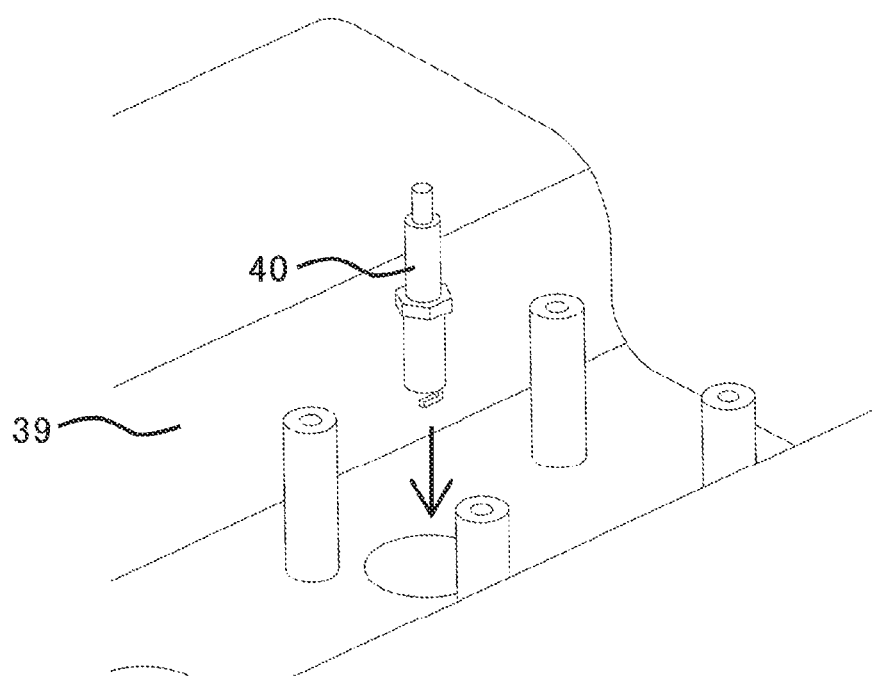
FIG. 21 is a perspective view showing a state before an ignition plug 40 is mounted to a fastening target body 39.

First, the ignition plug 40 is assembled to the fastening target body 39 (see FIG. 21).

Then, the protector 14 is mounted to the ignition plug 40. As a result, the coupling circuit and the ignition plug 40 are directly connected to each other.

It is assumed that, a peripheral portion of the cover 1 is provided with at least three flange holes 41, and that the fastening target body 39 is provided with at least three fastening portions 42 corresponding to the flange holes 41 of the cover 1.

Figure 22:
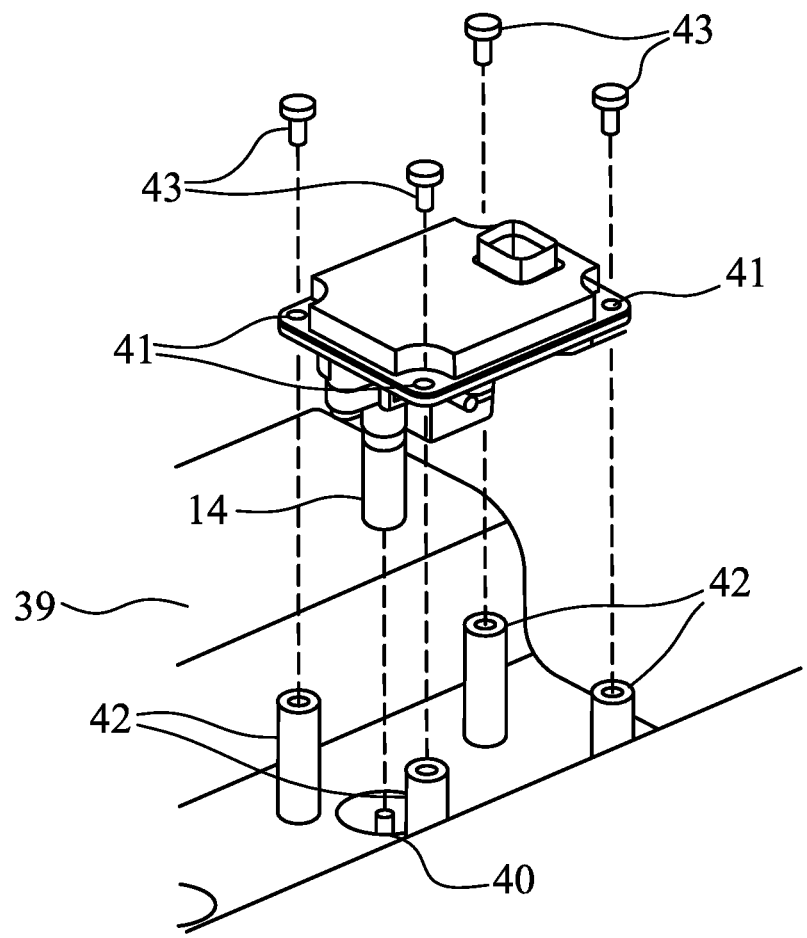
FIG. 22 is a perspective view showing a state before the high frequency discharge ignition apparatus shown in FIG. 1 is mounted to the fastening target body 39.

Then, the ignition apparatus of the present invention may be fastened with screws or bolts 43 via the flange holes 41 to the fastening portions 42 of the fastening target body 39 (see FIG. 22).

Figure 23:
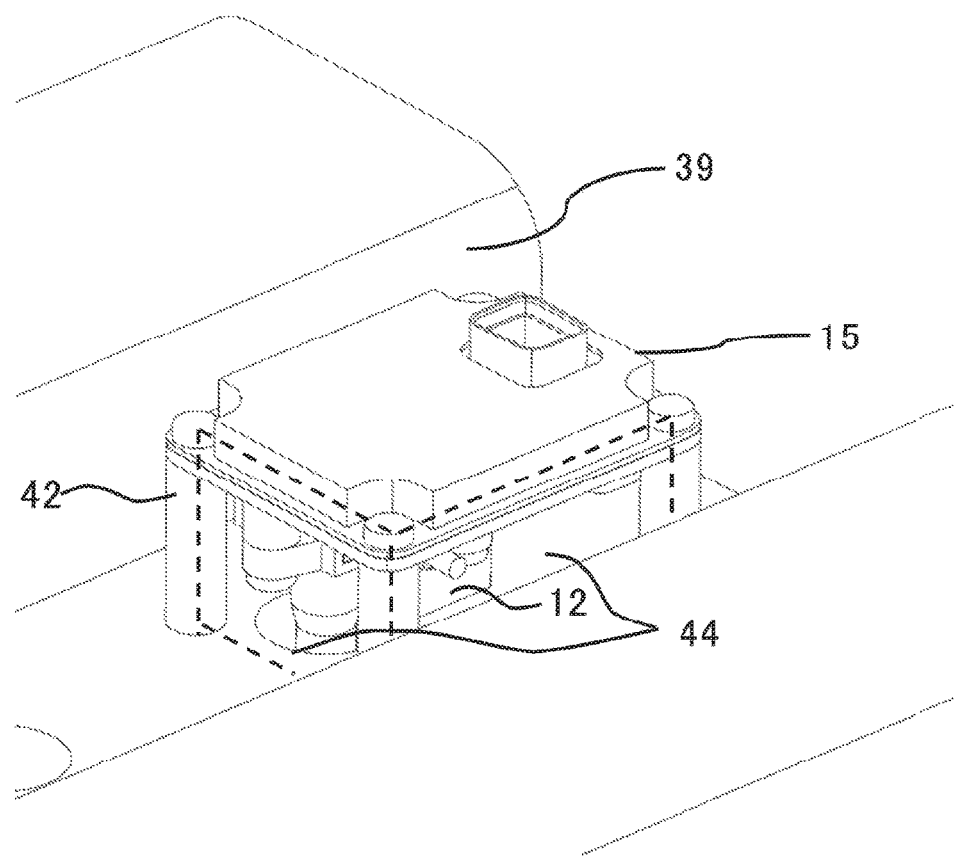
FIG. 23 is a perspective view showing a space realized after the high frequency discharge ignition apparatus shown in FIG. 1 is mounted to the fastening target body.

In this manner, by the first housing 12 being disposed inside a space 44 formed by the flanges of the second housing 15 and the fastening portions 42 of the fastening target body 39, radiation noise occurring from the output circuit can be suppressed (see FIG. 23).

As described above, embodiment 1 employs the configuration in which: as shown in FIG. 19, the one side 33 of the terminal 7, the through hole 21, and the opening 20 are disposed on one straight line that is perpendicular to opposed faces of the first housing 12 and the second housing 15; as shown in FIG. 20, the first housing 12 and the second housing 15 are integrally fixed to each other; and further as shown in FIG. 23, the first housing 12 is disposed inside the space 44 formed by the flanges of the cover 1 and the fastening portions 42 of the fastening target body 39.

As a result, the length of the loop in which high frequency energy is conducted is reduced, whereby noise occurring from the loop can be reduced, and the entirety of the apparatus can be downsized. Further, since the range to provide shielding in the entirety of the apparatus can be reduced, it becomes easy to take measures against noise.

Embodiment 2

Figure 24:
FIG. 24 is an exploded perspective view showing a schematic configuration of embodiment 2 of the present invention.
Figure 24:
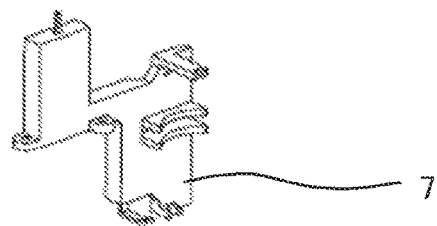
Figure 24:
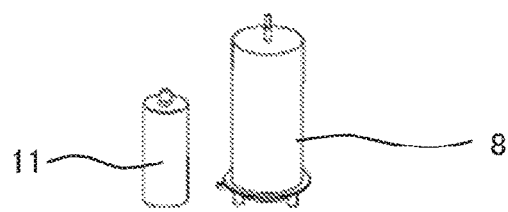
Figure 24:
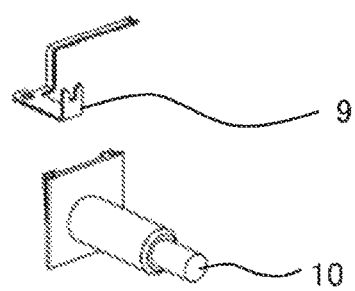
Figure 24:
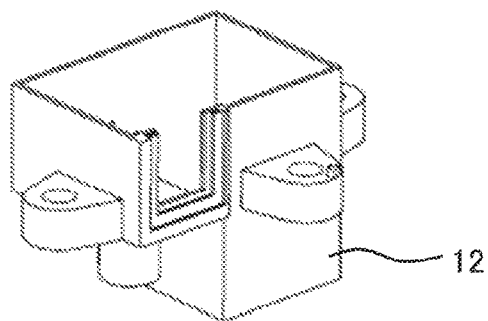

In embodiment 1 above, the packing 6 is inserted or an adhesive is used in the groove portion 24 in a resin material multiple molded portion of the terminal 7, whereby waterproofing with the base 5 is realized. However, instead of the resin material multiple molded portion of the terminal 7, a lid 45 may be used to ensure waterproofing with the base 5. FIG. 24 shows a component configuration in the case where the lid 45 is used.

Figure 25:
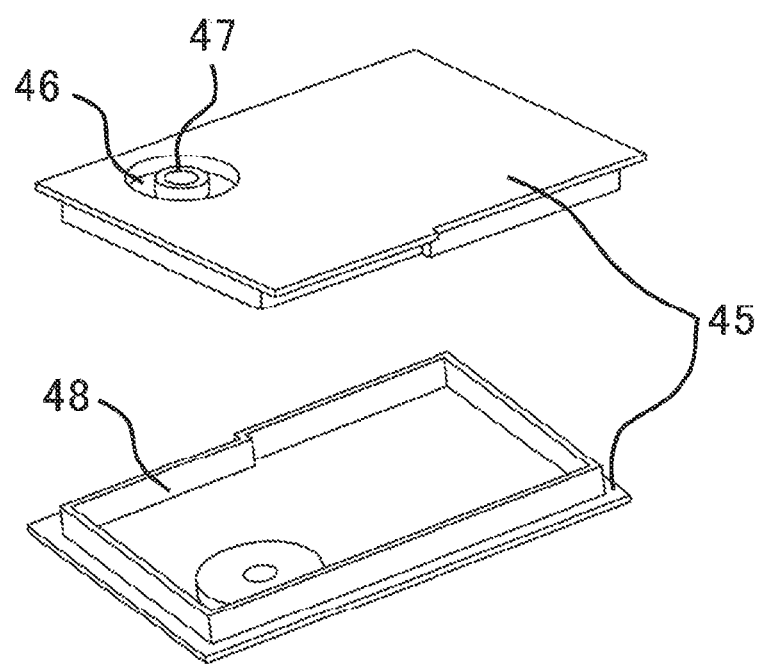
FIG. 25 is a perspective view showing the external shapes of both faces of a lid 45 shown in FIG. 24.

The lid 45 includes: on the outer face thereof, a groove portion 46 and a fit portion 47 for fitting the lid 45 the terminal 7 to each other; and on the rear face of the lid 45, a protrusion 48 having a height that allows the protrusion 48 to be immersed in the cast resin 32 (see FIG. 25). The positional relationship between the terminal 7 and the lid 45 is determined according to the size of the fit portion 47.

Figure 26A:
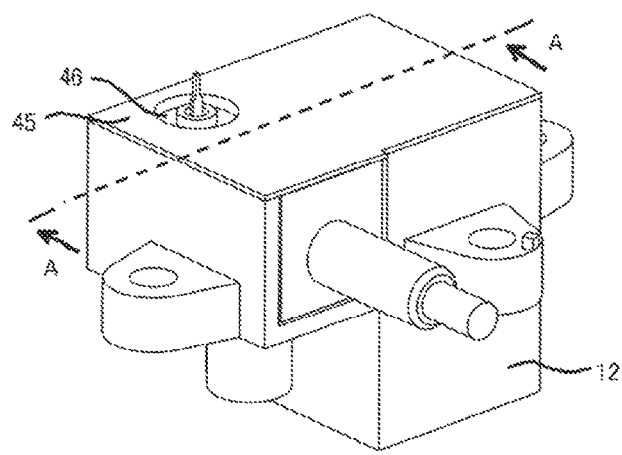
FIG. 26A is a perspective view showing a state after the lid 45 shown in FIG. 24 is mounted to the first housing 12 and further cast resin is poured therein.
Figure 26B:
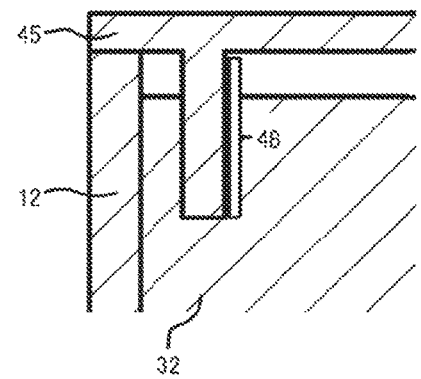
FIG. 26B is a cross-sectional view showing a state after the lid 45 shown in FIG. 24 is mounted to the first housing 12 and further cast resin is poured therein.

As in embodiment 1 above, the first housing 12 and the lid 45 may be fixed to each other by means of the cast resin 32, after the components up to the terminal member 10 have been assembled to the first housing 12 (see FIGS. 26A and 26B).

For realizing waterproofing between the lid 45 and the base 5, the packing 6 may be inserted or an adhesive may be used in the groove portion 46 provided in the lid 45.

As described above, embodiment 2 has a structure that realizes a waterproofing mode different from that in embodiment 1, and the lid 45 for waterproofing is fixed together with the first housing 12 by means of the cast resin 32, whereby entry of water from outside can be prevented.

Embodiment 3

Figure 27A:
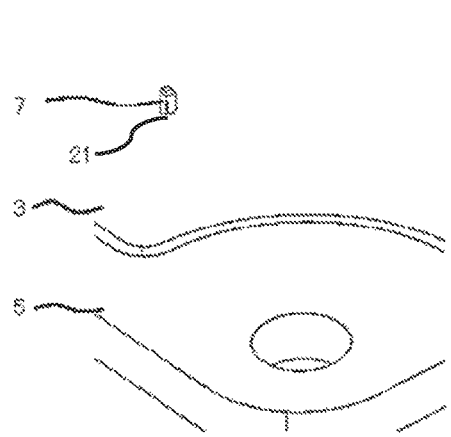
FIG. 27A is a perspective view showing a configuration of the terminal 7 of embodiment 1 of the present invention.

In embodiment 1 above, as shown in FIG. 27A, the terminal 7 is inserted in the through hole 21 in the electronic circuit board 3, and is electrically connected to a circuit (not shown) such as an input/output portion of the electronic circuit board 3. However, without using the electronic circuit board 3, the terminal 7 and an electronic component may be directly connected to each other.

Figure 27B:
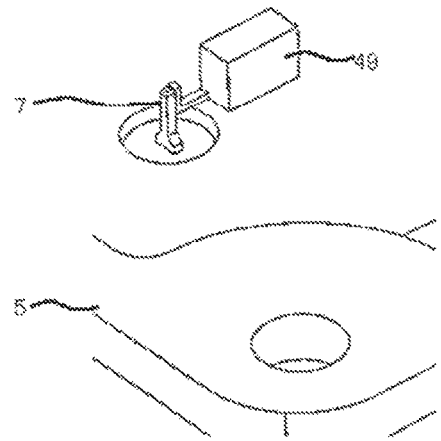
FIG. 27B is a perspective view showing a configuration of the terminal 7 of embodiment 3 of the present invention.

For example, as shown in FIG. 27B, the circuit such as an input/output portion of embodiment 1 may be replaced with a circuit composed of an electronic component 49 and a plurality of other components, and the terminal 7 and the electronic component 49 may be electrically connected to each other.

Thus, the structure according to embodiment 3 makes it possible to provide electric connection even for a circuit that does not use a circuit board.

Embodiment 4

Figure 28A:
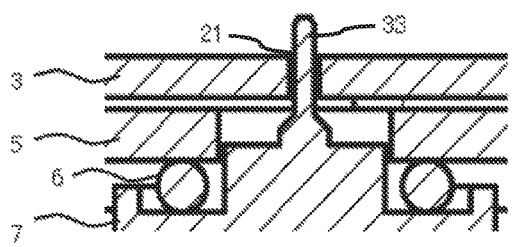
FIG. 28A is a cross-sectional view showing a configuration of the terminal 7 of embodiment 1 the present invention.

In embodiment 1 above, as shown in FIG. 28A, the one side 33 of the terminal 7 protruding from the first housing 12 is fitted in the through hole 21 in the electronic circuit board 3 of the high frequency energy supply circuit 103, to provide electric connection. However, this fit-in method can be changed.

Figure 28B:
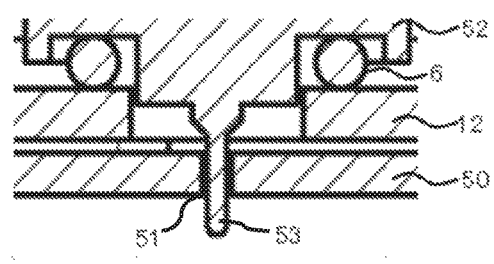
FIG. 28B is a cross-sectional view showing a configuration of the terminal 7 of embodiment 4 of the present invention.

For example, as shown in FIG. 28B, electric connection may be provided by fitting one side 53 of a terminal 52 protruding from the high frequency energy supply circuit 103, into a fit-in portion 51 of an electronic circuit board 50 of the first housing 12.

Thus, in the structure according to embodiment 4, the terminal 52 is caused to protrude from the second housing 15, to be fitted into the first housing 12, thereby making it possible to provide electric connection.

Embodiment 5

Figure 29A:
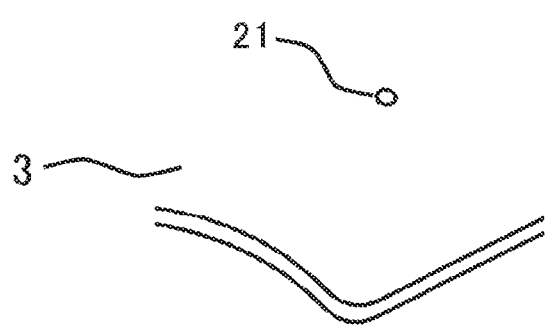
FIG. 29A is a perspective view showing arrangement of a through hole 21 of embodiment 1 of the present invention.
Figure 29B:
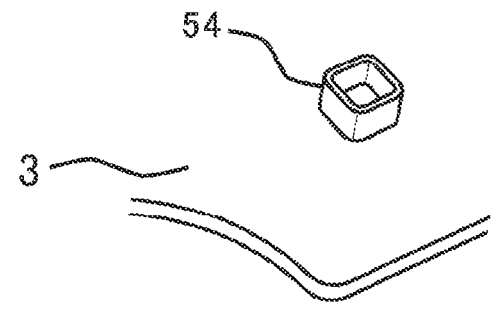
FIG. 29B is a perspective view showing arrangement of a connector 54 of embodiment 5 of the present invention.
Figure 30:
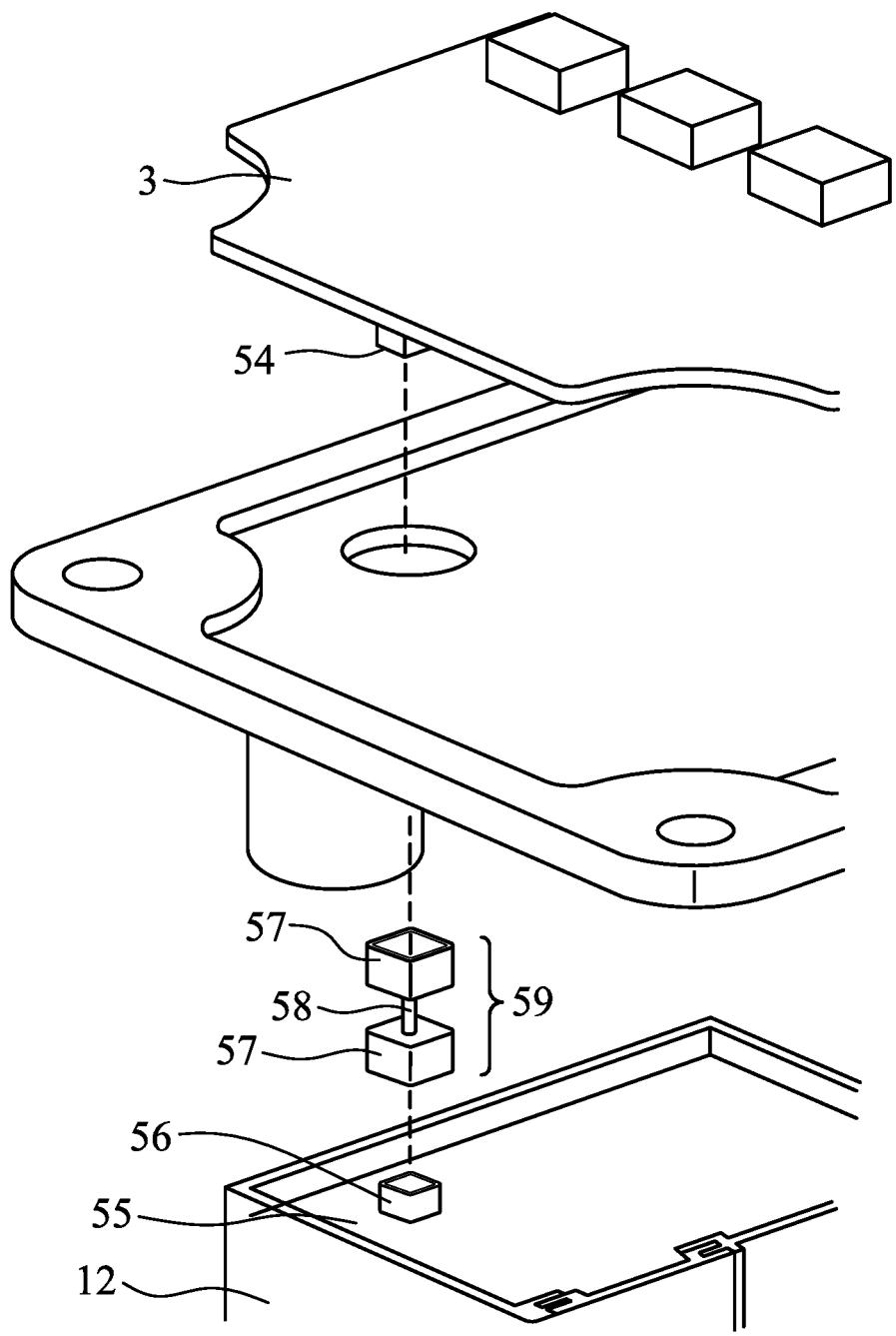
FIG. 30 is a perspective view showing another configuration of embodiment 5 of the present invention.

In embodiment 1 above, as shown in FIG. 29A, the through hole 21 is used in order to electrically connect the terminal 7 and the electronic circuit board 3 to each other. However, as shown in FIG. 29B, a connector 54 may be used. In this case, as shown in FIG. 30, if the first housing 12 includes an electronic circuit board 55 and a connector 56, the electronic circuit board 3 and the electronic circuit board 55 may be electrically connected to each other by using an intermediate harness 59 composed of connectors 57 and a wire 58. Thus, with the structure of embodiment 5, integration of the housings can be realized even through connection between connectors, other than through connection using the terminal 7 inserted through the through hole 21.

Embodiment 6

Figure 32:
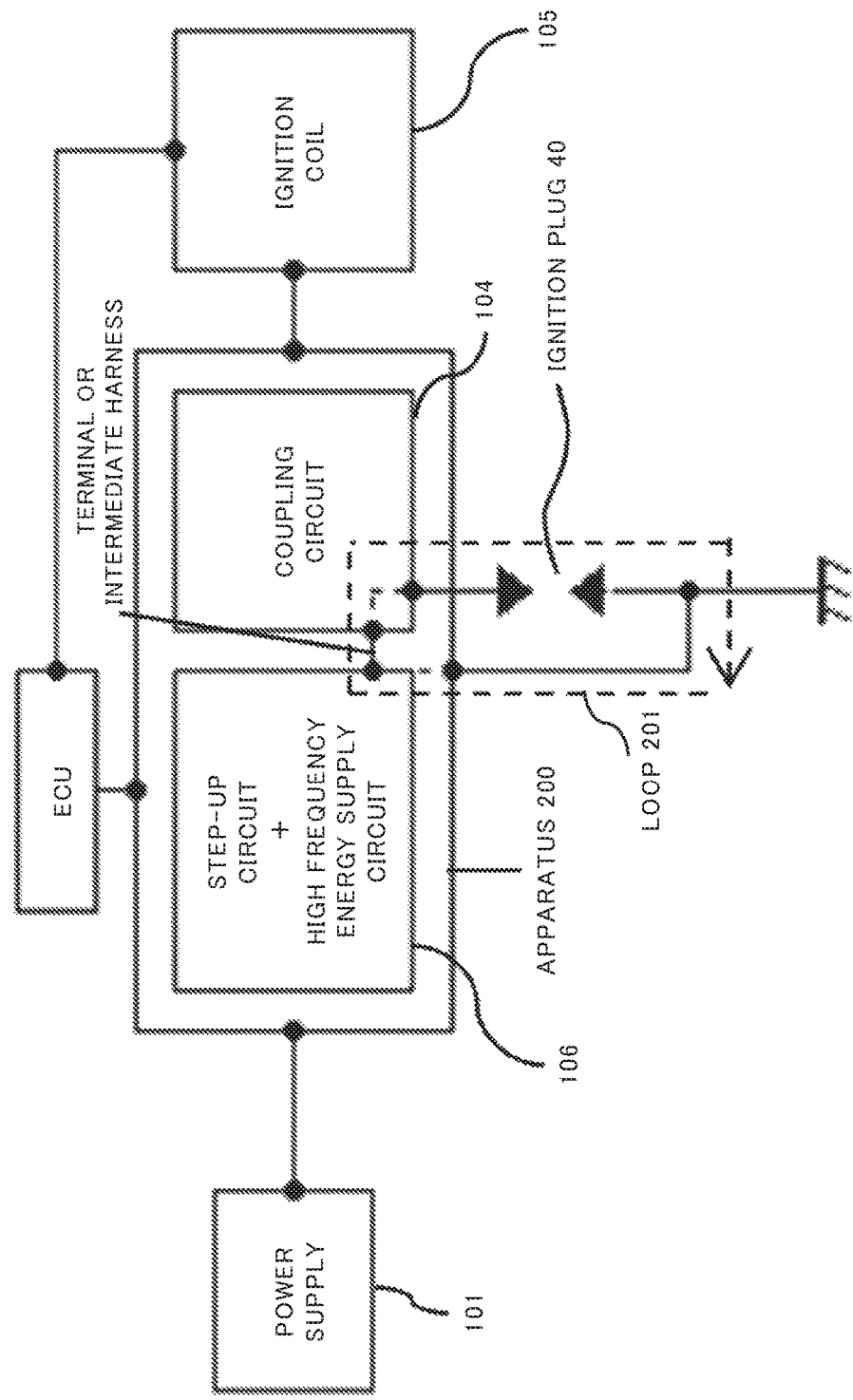
FIG. 32 is a block diagram showing a circuit configuration of a high frequency discharge ignition apparatus of embodiment 6 of the present invention.

In embodiment 1 above, as shown in FIG. 2, a step-up circuit 102 is provided separately from the high frequency energy supply circuit 103. However, as shown in FIG. 32, the step-up circuit may be included in the high frequency energy supply circuit, whereby further downsizing may be realized.

Embodiment 7

Figure 33A:
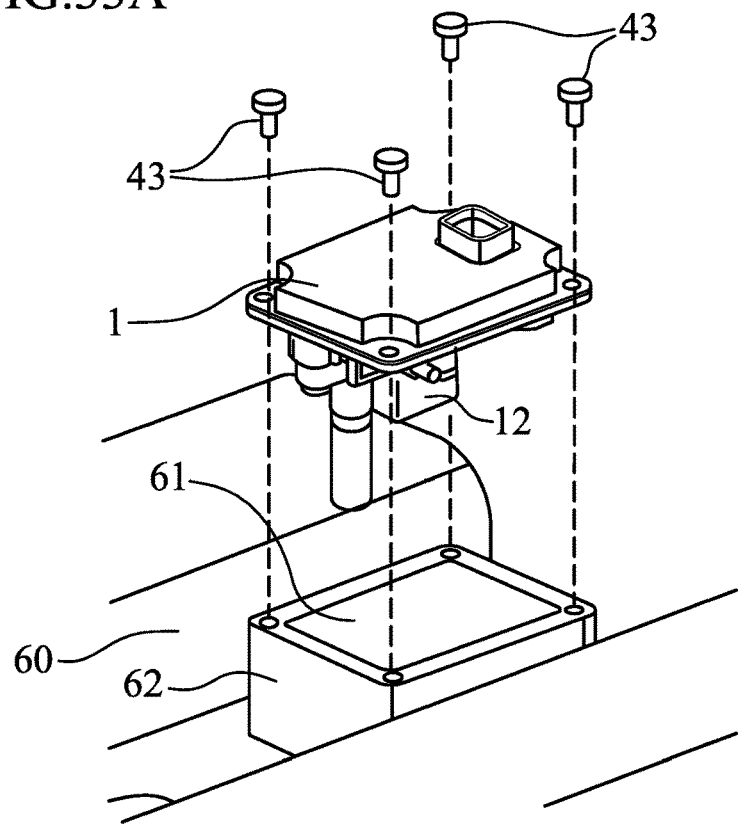
FIG. 33A is an exploded perspective view showing a configuration of embodiment 7 of the present invention.

In embodiment 1 above, as shown in FIG. 22, the high frequency discharge ignition apparatus of the present invention is fastened by the screws or bolts 43 to the fastening portions 42 of the fastening target body 39. However, when further noise suppression is required, a fastening target body 60 may be shaped as shown in FIG. 33A. That is, a protrusion 62 provided with a hole 61 is caused to protrude from the fastening target body 60, the first housing 12 is disposed inside the hole 61, and then, the high frequency discharge ignition apparatus of the present invention is fastened to the protrusion 62.

Figure 33B:
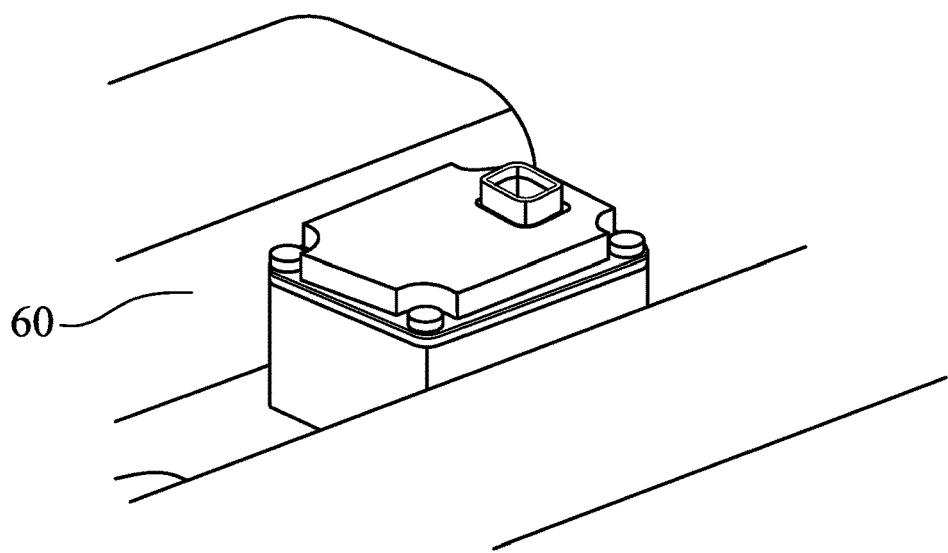
FIG. 33B is a perspective view showing a configuration of embodiment 7 of the present invention.

Accordingly, in embodiment 7, the entirety of the first housing 12 is covered by a metal body, and thus, noise reduction effect is higher than in embodiment 1. FIG. 33B shows a state in which the assembly has been completed according to the present embodiment.

Embodiment 8

Figure 34A:
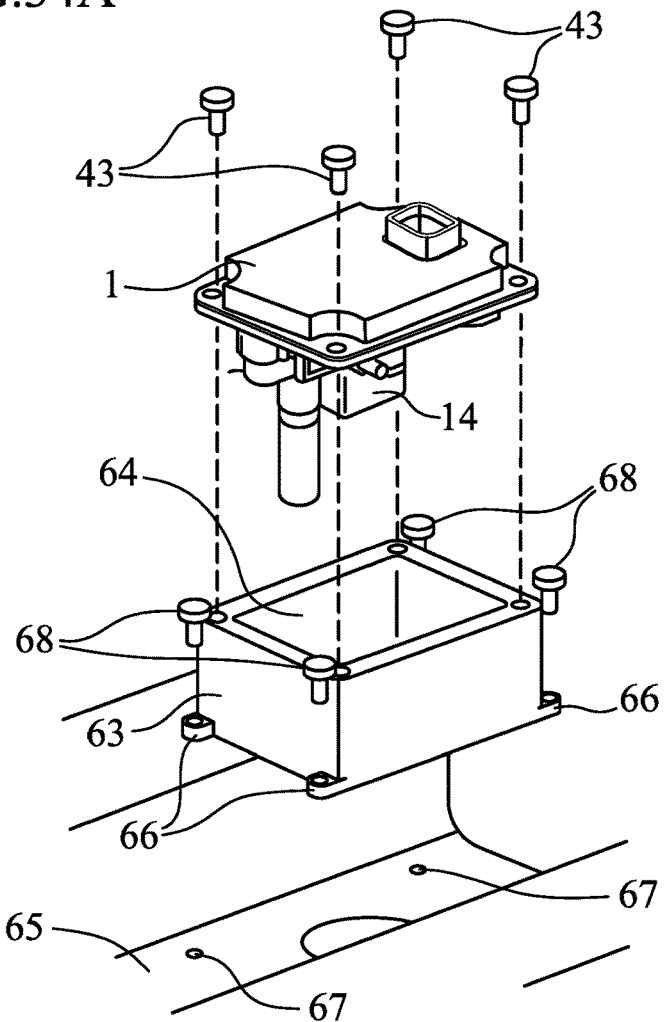
FIG. 34A is an exploded perspective view showing a configuration of embodiment 8 of the present invention.

Further, when it is difficult to provide the protrusion 62 to the fastening target body 60 of embodiment 7, a metal component 63 as shown in FIG. 34A may be used. The metal component 63 is provided with a hole 64, and fastening portions 66 for fastening to a fastening target body 65. First, with screws or bolts 68, the metal component 63 is fastened to fastening portions 67 of the fastening target body 65, then, the first housing 12 is disposed inside the hole 64, and then further, the high frequency discharge ignition apparatus of the present invention is fastened to the metal component 63, whereby the entirety of the first housing 12 is covered by a metal body.

Figure 34B:
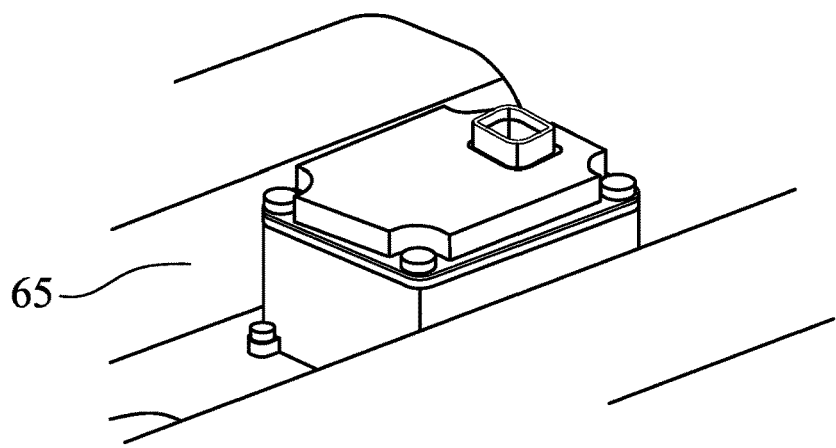
FIG. 34B is a perspective view showing a configuration of embodiment 8 of the present invention.

Accordingly, the structure of embodiment 8 realizes higher noise reduction effect than embodiment 1. FIG. 34B shows a state in which the assembly has been completed according to the present embodiment.

It is noted that, within the scope of the present invention, the above embodiments may be freely combined with each other, or each of the above embodiments may be modified or simplified as appropriate.

What is claimed is:

1. A high frequency discharge ignition apparatus for coupling high frequency energy supplied from a high frequency energy supply circuit, with a high voltage pulse supplied from an ignition coil, and supplying the coupled energy to an ignition plug, the high frequency discharge ignition apparatus comprising:
    a first housing having therein an output circuit for supplying the coupled energy to the ignition plug;
    a second housing having therein the high frequency energy supply circuit; and
    a connection member electrically connecting the output circuit and the high frequency energy supply circuit to each other, wherein
    the first housing and the second housing are fixed to each other with faces thereof opposed to each other, and
    the connection member is connected via pass-through portions provided at positions that are close to each other in the respective opposed faces.

2. The high frequency discharge ignition apparatus according to claim 1, wherein
    the connection member and the pass-through portions are disposed on a straight line and being perpendicular to the opposed faces of the first housing and second housing.

3. The high frequency discharge ignition apparatus according to claim 1, wherein
    one of the first housing and the second housing that has a greater opposed face is made of metal, and the other of the first housing and the second housing is disposed so as not to extend out of the one housing that has the greater opposed face, except portions including a connection portion.

4. The high frequency discharge ignition apparatus according to claim 3, wherein
    the opposed face of the one housing made of metal is surrounded by a metal body, and
    the other housing is disposed in a space surrounded by the metal body.

5. The high frequency discharge ignition apparatus according to claim 4, wherein
    the metal body is formed at a fastening target body to which an ignition device is assembled, and
    the metal body is fastened to the fastening target body via flanges formed at three or more positions on a peripheral portion of the one housing made of metal.

6. The high frequency discharge ignition apparatus according to claim 1, wherein
    the connection member is composed of an intermediate harness and a connector, and
    a first connector provided at the pass-through portion of the first housing and connected to an output end of the output circuit and a second connector provided at the pass-through portion of the second housing and connected to an output end of the high frequency energy supply circuit are connected to each other by the intermediate harness.

7. The high frequency discharge ignition apparatus according to claim 1, wherein
    the connection member is a terminal that protrudes from either one of the output circuit and the high frequency energy supply circuit, and that is connected to the other of the output circuit and the high frequency energy supply circuit.

8. The high frequency discharge ignition apparatus according to claim 1, wherein
    the connection member is composed of a terminal protruding from the output circuit and a connector to be used in electric connection to an external circuit mounted on a circuit board of the high frequency energy supply circuit, and uses a through hole provided on the circuit board, as a conductive portion for connecting the terminal.

9. The high frequency discharge ignition apparatus according to claim 8, wherein
    connection between the terminal and the through hole is provided by soldering.

10. The high frequency discharge ignition apparatus according to claim 8, wherein
    connection between the terminal and the through hole is provided by press-fit.

11. The high frequency discharge ignition apparatus according to claim 8, wherein
    the terminal includes a fit portion, and
    positioning between the terminal and the electronic component is realized through fitting between the fit portion and an electronic component forming the output circuit.

12. The high frequency discharge ignition apparatus according to claim 8, wherein
    the terminal includes a holding portion, and is positioned inside the first housing via the holding portion.

13. The high frequency discharge ignition apparatus according to claim 12, wherein either one of the holding portion and an inner portion of the first housing is provided with a boss hole, and the other of the holding portion and the inner portion of the first housing is provided with a protrusion having a crush rib, and the protrusion is press-fitted in the boss hole.

14. The high frequency discharge ignition apparatus according to claim 1, wherein the first housing is waterproofed by means of resin, the second housing has a packing provided between a periphery of the terminal extending from the first housing and an outer wall surface of an opening formed in the pass-through portion of the second housing, and the first housing and the second housing are fixed to each other to be waterproofed.

15. The high frequency discharge ignition apparatus according to claim 1, wherein the first housing is waterproofed by means of resin, the second housing is provided with an adhesive applied between a periphery of the terminal protruding from the pass-through portion of the first housing and an outer wall surface of an opening formed in the pass-through portion of the second housing, and the first housing and the second housing are fixed to each other to be waterproofed.

16. The high frequency discharge ignition apparatus according to claim 14, wherein a groove for holding the packing is provided in the periphery of the terminal.

17. The high frequency discharge ignition apparatus according to claim 15, wherein a groove for holding the adhesive is provided in the periphery of the terminal.

18. The high frequency discharge ignition apparatus according to claim 1, wherein the opposed face to the second housing of the first housing is formed by a lid-shaped member, and is provided so as to cover an upper part of resin in which the output circuit provided in the first housing is sealed, a packing is disposed in a groove provided around the pass-through portion for the terminal, of the lid-shaped member, and the first housing and the second housing are fixed to each other, whereby the packing is crushed by the second housing to prevent entry of water.

19. The high frequency discharge ignition apparatus according to claim 18, wherein the lid-shaped member has a protrusion having a height that allows the protrusion to be immersed in the resin.

* * * * *